(12) United States Patent
Hart et al.

(10) Patent No.: US 10,118,426 B2
(45) Date of Patent: Nov. 6, 2018

(54) NANOPOROUS STAMP FOR FLEXOGRAPHIC PRINTING

(71) Applicant: Massachusetts Institute of Technology, Cambridge, MA (US)

(72) Inventors: Anastasios John Hart, Somerville, MA (US); Sanha Kim, Cambridge, MA (US); Hossein Sojoudi, Medford, MA (US); Karen K. Gleason, Cambridge, MA (US)

(73) Assignee: MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 0 days.

(21) Appl. No.: 14/951,854

(22) Filed: Nov. 25, 2015

(65) Prior Publication Data

US 2016/0152059 A1     Jun. 2, 2016

Related U.S. Application Data

(60) Provisional application No. 62/213,720, filed on Sep. 3, 2015, provisional application No. 62/083,954, filed on Nov. 25, 2014.

(51) Int. Cl.
| | |
|---|---|
| *B41M 1/04* | (2006.01) |
| *B41K 3/62* | (2006.01) |
| *B41F 5/24* | (2006.01) |
| *B41C 1/00* | (2006.01) |
| *G03F 7/00* | (2006.01) |
| *B41C 1/05* | (2006.01) |
| *B41N 1/12* | (2006.01) |

(52) U.S. Cl.
CPC .............. *B41K 3/62* (2013.01); *B41C 1/00* (2013.01); *B41F 5/24* (2013.01); *B41M 1/04* (2013.01); *G03F 7/0002* (2013.01); *G03F 7/0015* (2013.01); *B41C 1/05* (2013.01); *B41N 1/12* (2013.01)

(58) Field of Classification Search
None
See application file for complete search history.

(56) References Cited

U.S. PATENT DOCUMENTS

| | | |
|---|---|---|
| 6,866,801 B1 | 3/2005 | Mau et al. |
| 7,521,292 B2 | 4/2009 | Rogers et al. |

(Continued)

OTHER PUBLICATIONS

International Preliminary Report on Patentability from corresponding PCT Application No. PCT/US2015/062606, dated Jun. 8, 2017.

(Continued)

*Primary Examiner* — Joshua D Zimmerman
(74) *Attorney, Agent, or Firm* — Cooley LLP

(57) ABSTRACT

A nanoporous stamp for printing a variety of materials is disclosed. The nanoporous stamp may include a substrate and an array of carbon nanotubes disposed on and attached to the substrate. The array of carbon nanotubes can have an etched top surface and a wettable, nanoporous structure, and may include a coating thereon. The nanoporous stamp can be used in a variety of printing applications, and can print, among other things, colloidal and non-colloidal inks on a variety of substrates with a high degree of accuracy and fidelity.

17 Claims, 25 Drawing Sheets

(56) References Cited

U.S. PATENT DOCUMENTS

| | | |
|---|---|---|
| 8,027,086 B2 | 9/2011 | Guo et al. |
| 8,950,324 B2 | 2/2015 | Berniard et al. |
| 8,991,314 B2 | 3/2015 | Cheng et al. |
| 9,073,759 B2 | 7/2015 | Zeng et al. |
| 2004/0028875 A1* | 2/2004 | Van Rijn ............... A61L 27/50 428/98 |
| 2006/0103694 A1 | 5/2006 | Nguyen |
| 2011/0204020 A1 | 8/2011 | Ray et al. |
| 2014/0329054 A1* | 11/2014 | Theivanayagam Chairman ......... B41M 1/00 428/156 |

OTHER PUBLICATIONS

Invitation to Pay Additional Fees dated Mar. 24, 2016 from corresponding International Application No. PCT/US15/62606.

International Search Report and Written Opinion for International Patent Application No. PCT/US2015/62606 dated Jun. 3, 2016.

Garcia, et al., "Fabrication and Nanocompression Testing of Aligned Carbon-Nanotube-Polymer Nanocomposites" Adv. Mater. 2007, 19, 2151?2156; DOI: 10.1002/adma.200700237; Published 2007; Retrieved from the internet: May 11, 2016; <URL: http://mechanosynthesis.mit.edu/journals/015_ejgarcia_amat_07_nanocompression>.

Bradford, P. D. et al., "Tuning the compressive mechanical properties of carbon nanotube foam," Carbon, vol. 49, pp. 2834-2841 (2011).

Brieland-Shoultz, A. et al., "Scaling the Stiffness, Strength, and Toughness of Ceramic-Coated Nanotube Foams into the Structural Regime," Adv. Funct. Mater., vol. 24, pp. 5728-5735 (2014).

Hart, A. J. et al., "Rapid growth and flow-mediated nucleation of millimeter-scale aligned carbon nanotube structures from a thin-film catalyst," Journal of Physical Chemistry B, vol. 110, pp. 8250-8257 (2006).

Kim, D. et al., "Magnetic-field-induced liquid metal droplet manipulation," Journal of Micromechanics and Microengineering, vol. 24, No. 5, 055018, 7 pages (2014).

Tawfick, S. et al., "Nanocomposite microstructures with tunable mechanical and chemical properties," Physical Chemistry Chemical Physics, vol. 12, pp. 4446-4451 (2010).

Yaglioglu, O. et al., "Wide range control of microstructure and mechanical properties of carbon nanotube forests: a comparison between fixed and floating catalyst CVD techniques," Advanced Functional Materials, vol. 22, No. 23, pp. 5028-5037 (2012).

\* cited by examiner

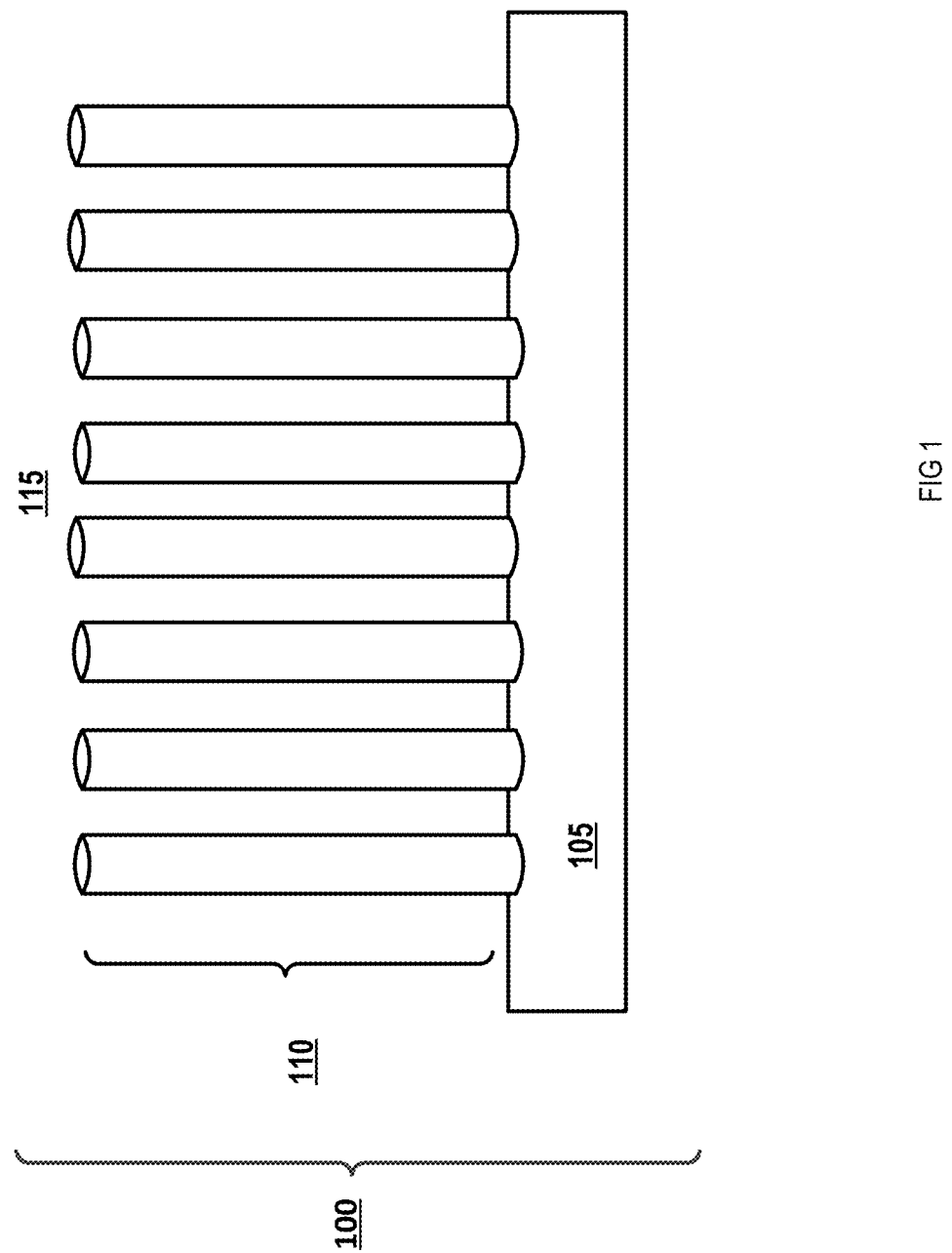

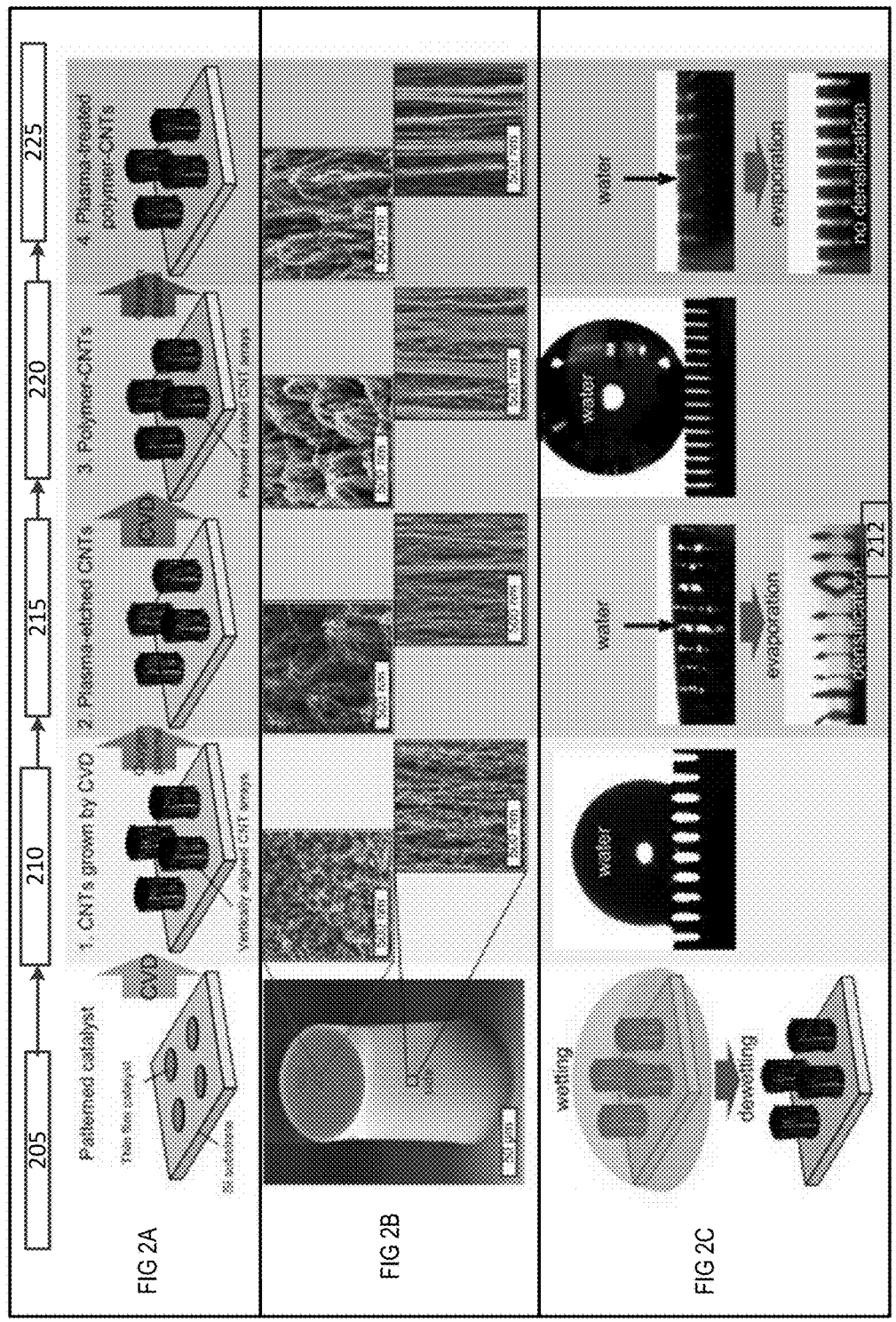

NANOPOROUS STAMP FOR FLEXOGRAPHIC PRINTING

CROSS-REFERENCES TO RELATED APPLICATIONS

This application claims a priority benefit to: (1) U.S. Provisional Application Ser. No. 62/083,954, entitled "Engineered Carbon Nanotube Stamp for High Performance Micro-Contact Printing," filed Nov. 25, 2014, the entirety of which is herein expressly incorporated by reference; and (2) U.S. Provisional Application Ser. No. 62/213,720, entitled "Engineered Carbon Nanotube Stamp for High Performance Micro-Contact Printing," filed Sep. 3, 2015, the entirety of which is herein expressly incorporated by reference.

GOVERNMENT SUPPORT

This invention was made with Government support under Grant No. FA9550-11-1-0089 awarded by the Air Force Office of Scientific Research. The United States Government has certain rights in the invention.

BACKGROUND

Methods for printing include screen, gravure, relief, and inkjet printing. The resolution of inkjet printing is determined by the size of the droplet ejected from the nozzle aperture, and due to the limiting strength and frequency of transducers compared to the force required to eject smaller liquid droplets, the droplet diameter is usually no smaller than 10-20 μm. Gravure printing uses ink transfer from individual cells engraved on the tool surface, thus the size and shape of the cells influence the printing resolution. In relief printing, a thin film of ink is first loaded from a textured roll onto to the top surfaces of the stamp, and is subsequently printed by pressing the stamp against the target. The resolution of relief printing has been more limited than inkjet and gravure printing because thin liquid films loaded on the solid stamps tend to dewet from the surface (due to hydrodynamic thin film instability) while thick films tend to spread outwards from the contact area. As a result, relief printing of uniform ink layers has generally limited feature sizes to 50 μm or larger.

SUMMARY

In view of the foregoing challenges relating to printing, various inventive embodiments disclosed herein are generally directed to a nanoporous stamp and methods for making and using the same. According to some embodiments, a nanoporous print stamp comprises nanoporous material including a plurality of carbon nanotubes (CNTs), in some implementations, aligned or substantially aligned CNTs. The CNTs can be attached to a substrate. In some embodiments, a nanoporous print or printing stamp comprises a print (top) surface configured and/or structured such that the lateral dimensions of the structures are about 1 to 2 times greater than the effective pore size of the stamp material. In some embodiments, the nanoporous print stamp is microstructured.

In some embodiments, a nanoporous print stamp can comprise a substrate and an array of carbon nanotubes disposed on and attached to the substrate, the array of carbon nanotubes having an etched top surface and a wettable, nanoporous structure. This nanoporous print stamp may be loaded with ink and contacted to a target substrate to print the ink. In another embodiment, the stamp comprises (1) a substrate; (2) a patterned array of aligned carbon nanotubes disposed on and attached to the substrate, where the patterned array of aligned carbon nanotubes has an etched top surface having an average pore size of 100 nm or less, and a wettable, nanoporous structure; and (3) a conformal polymer coating disposed on the aligned carbon nanotubes of the patterned array. The polymer coating forms bonds between at least a portions of the carbon nanotubes of the patterned array and is configured to reduce capillary-induced deformation of the patterned array of carbon nanotubes when in use, and the surface modulus of the patterned array of aligned carbon nanotubes and the compressive modulus of the patterned array of aligned carbon nanotubes are the same order or magnitude.

According to some embodiments, a method of making a nanoporous printing stamp comprises growing an array of aligned carbon nanotubes on a substrate and treating the upper surface of the array of aligned carbon nanotubes to remove a surface cluster layer. A conformal polymer coating may be applied to the treated upper surface of the array of aligned carbon nanotubes to increase resistance to elastocapillary densification and reduce capillary-induced deformation of the array of aligned carbon nanotubes. Nonconformal portions of the applied coating can be removed, and a wettable, nanoporous structure is provided.

A nanoporous stamp of the disclosure can be used in a variety of printing methods. For example, a nanoporous stamp may be used for flexographic nanoporous stamp printing by loading a patterned nanoporous stamp with ink. The patterned nanoporous stamp can have a plurality of micro-scale features, such that during the loading, ink is drawn into microstructures via capillary wicking. The loaded stamp can be contacted with a nanoporous scour to remove excess ink from the patterned nanoporous stamp, and a pattern can be printed on a target substrate with the loaded patterned nanoporous stamp by contacting the patterned nanoporous stamp to the target substrate to form nanoscale contact points between the target substrate and the plurality of micro-scale features of the nanoporous stamp such that ink is drawn out of the microstructures and onto the target substrate.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIG. 1 is a block diagram illustrating the structure of a nanoporous stamp according to some embodiments;

FIG. 1AA provides SEM images of a cross-section of a nanoporous stamp carbon nanotube (CNT) microstructure after infiltration of silver nanoparticle ink according one implementation;

FIGS. 2A-2E illustrate fabrication, wetting behaving and mechanical properties of microstructured nanoporous stamps according to some embodiments;

DETAILED DESCRIPTION

Following below are more detailed descriptions of various concepts related to, and embodiments of, inventive methods and apparatus for nanoporous stamps and printing. It should be appreciated that various concepts introduced above and discussed in greater detail below may be implemented in any of numerous ways, as the disclosed concepts are not limited to any particular manner of implementation. Examples of specific implementations and applications are provided primarily for illustrative purposes.

I. OVERVIEW

As shown in FIG. 1, a nanoporous stamp 100 according to some embodiments of the disclosure may comprise a substrate 105 and a patterned or unpatterned array of carbon nanotubes (CNTs) 110 disposed on and attached to the substrate 105, the array of carbon nanotubes having a nanoporous top surface 115, the "top surface" being a surface distal to the (support) substrate 105. The array also has a wettable nanoporous structure configured to allow infiltration of a printing material (i.e., ink). In some embodiments, the top surface is etched. In some embodiments, the array of CNTs is aligned or substantially aligned. As detailed below, properties of the array and top surface can be configured based on the desired print resolution, print pattern, target substrate, ink, and/or the like.

Figure 1A:
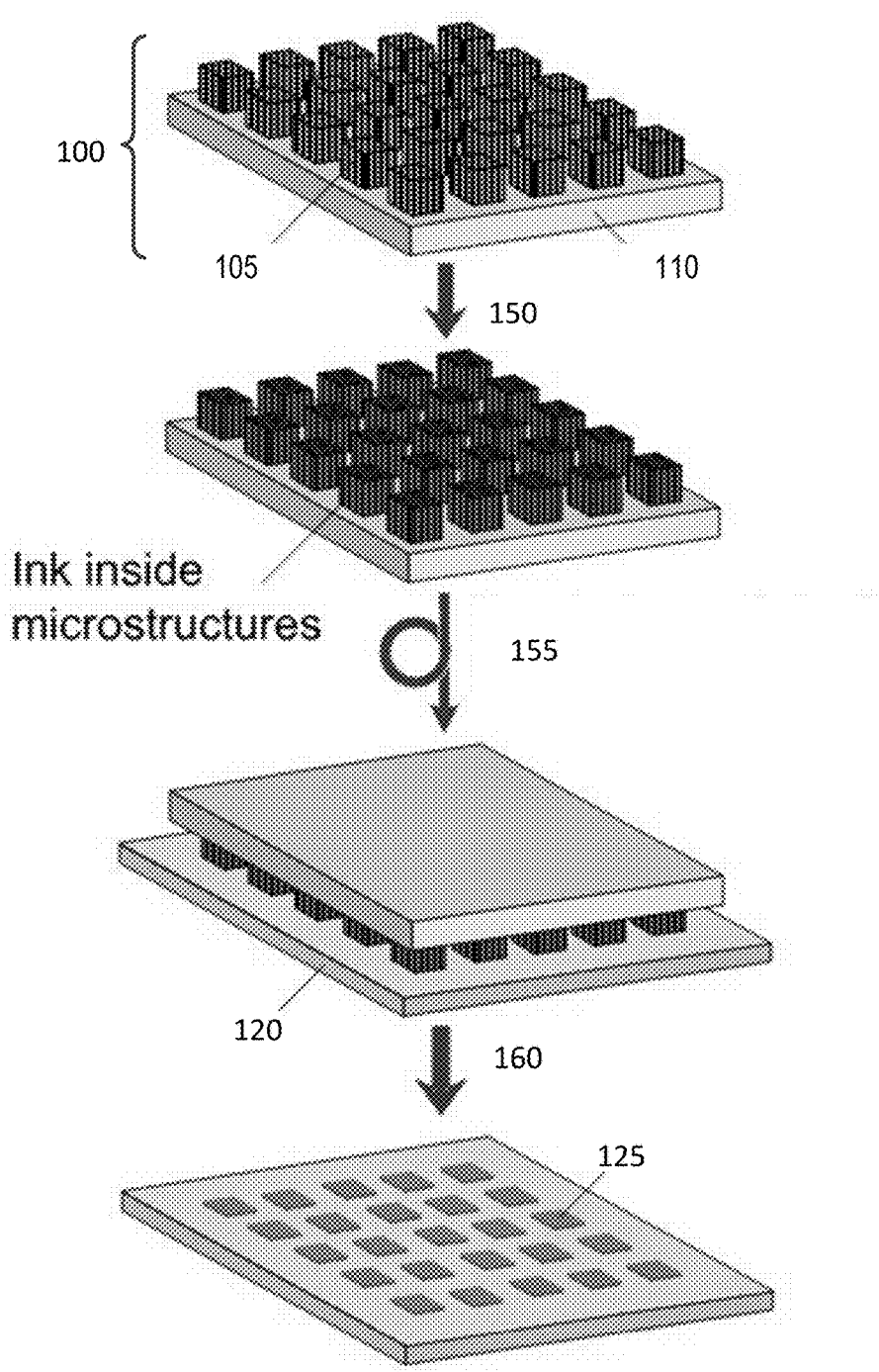
FIG. 1A illustrates an example printing procedure using a microstructured nanoporous stamp, according to one embodiment.
Figure 1A:
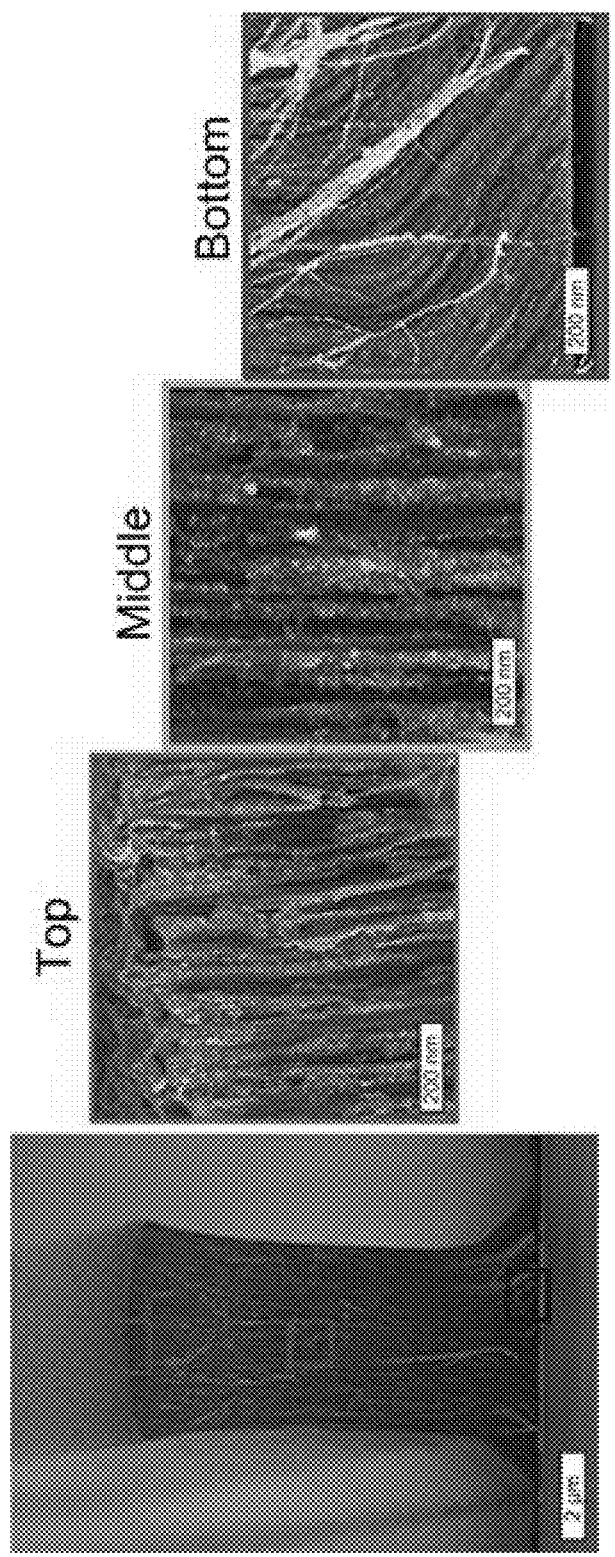

FIG. 1A shows an exemplary (manual) printing process using a nanoporous stamp 100 according to an embodiment of the disclosure, though it is to be understood that the disclosed nanoporous stamps may be used on a wide variety of printing processes, types and machinery, including but not limited to high-speed flexographic printing using a nanoporous stamp or stamps. In this example, the stamp is inked or loaded 150 with an ink, for example, a nanoparticle-based ink. During the loading 150, which may be done via immersion, spin coating, partial immersion, spraying, via ink jet loading, and/or like loading or inking methods, the ink is drawn into the nanoscale pores within each microstructure by capillary wicking. FIG. 1AA provides SEM images of a cross-section of an example CNT microstructure after infiltration of silver nanoparticle ink (50 wt % of ~10 nm silver nanoparticles dispersed in tetradecane) and dried at ambient conditions for 3 days, showing silver nanoparticles throughout the structure.

Figure 1B:
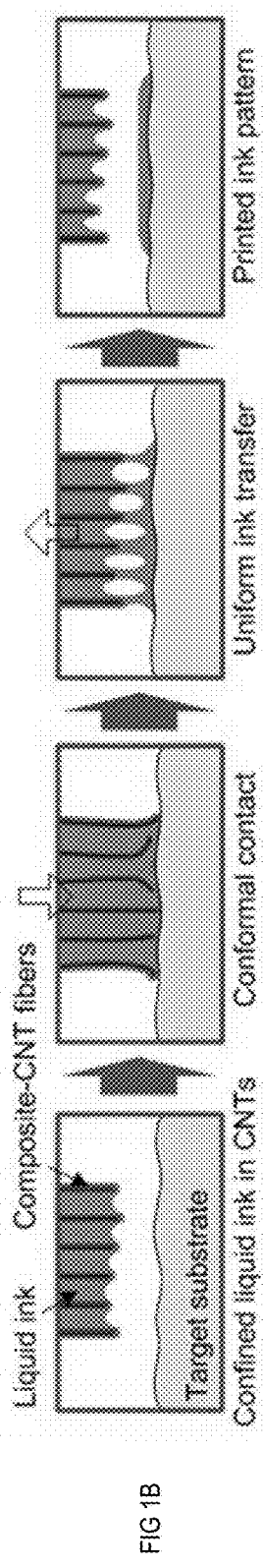
FIG. 1B details uniform transfer a liquid-phase ink from a nanoporous stamp to target substrate surface via conformal contact, according to one embodiment.
Figure 1C:
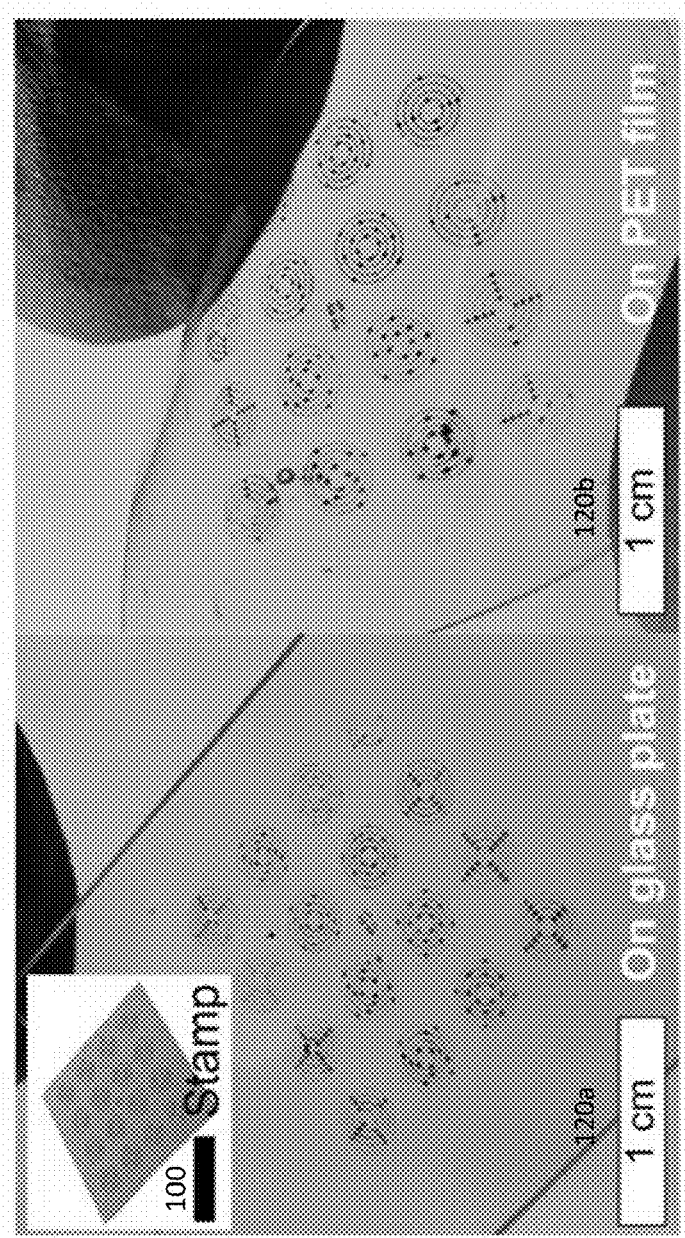
FIG. 1C provides SEM images of stamp features according to an embodiment of the disclosure.
Figure 1D:
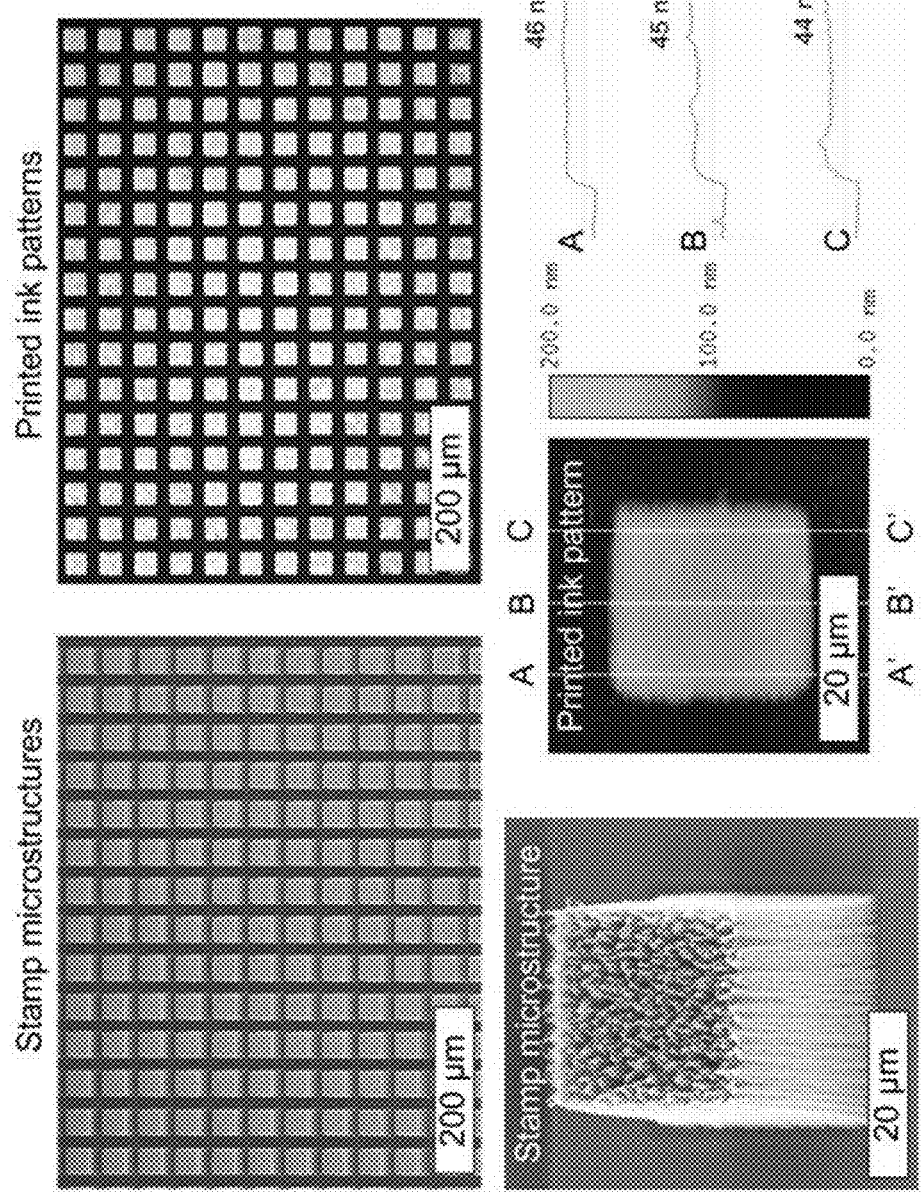
FIGS. 1D and 1E provides images of exemplary stamps and printed patterns, according to some implementations.
Figure 1E:
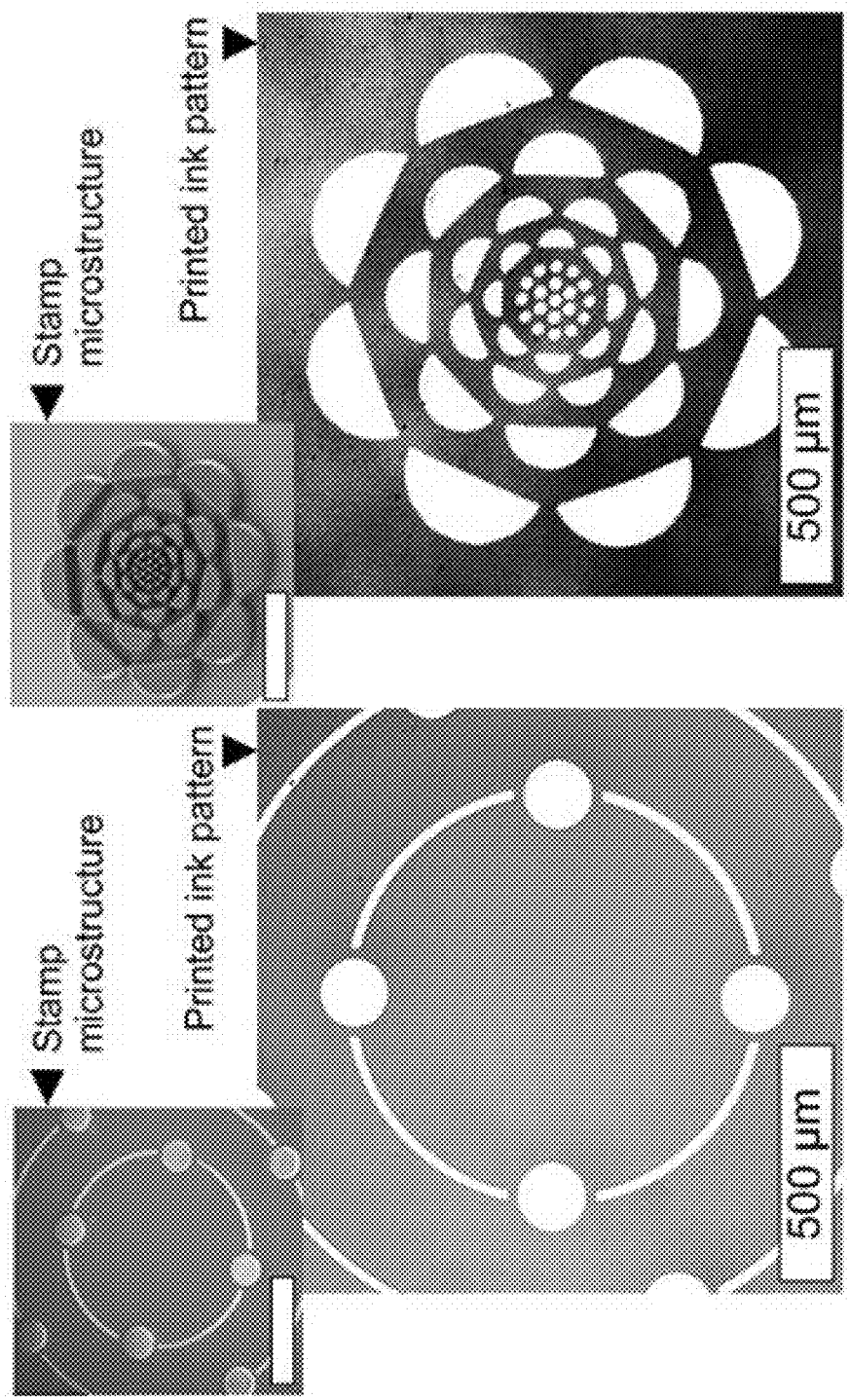

The stamp 100 can then be brought into contact 155 with a target substrate 120 and withdrawn 160, causing transfer of a thin ink layer 125 matching the pattern of the microstructures on the stamp 100. As discussed below, the pressure applied during printing can determine the resolution and fidelity of the printing. FIG. 1B provides a further illustrative overview of an exemplary print process, showing uniform of transfer a liquid-phase ink from the nanoporous stamp to target substrate surface via conformal contact. FIG. 1C provides an example stamp 100 and corresponding patterns made on a glass target substrate 120a and a plastic film 120b, under moderate pressure (e.g., 1-10 kPa) for a short time (e.g., 1-5 seconds). By adjusting the pressure and time for the pattern, stamp, ink and target substrate, the disclosed methods provide for printing patterns of microstructures on the stamp with high fidelity. FIG. 1D provides an example implementation illustrating this high resolution, with arrays of printed squares (25 μm side length and 10 μm spacing) using a nanoporous stamp have 3 μm corner radius, 0.2 μm edge roughness and uniform thickness of ~45 nm. Nanoporous stamps can be fabricated and used to print diverse patterns with different shapes and sizes, as shown by FIG. 1E.

II. STAMP FORMATION AND PREPARATION

In some embodiments, design and fabrication of the nanoporous stamp can be based on the following parameters: (1) the nanoporous stamp will have pores (e.g., as measured by distance between CNTs, average distance between CNTs, pore diameter or average pore diameter) larger (e.g., about 1.5× to 9×, including about 1.5×, 2×, 2.5×, 3×, 3.5×, 4×, 4.5×, 5×, 5.5×, 6×, 6.5×, 7×, 7.5×, 8×, 8.5×, or 9×, inclusive of all ranges or subranges therebetween) or significantly larger (e.g., 0.5 to 2 orders of magnitude) than the colloidal ink particles or molecules to be printed, yet smaller (less than) or significantly smaller (0.1 to 2 orders of magnitude) than the features to be printed; (2) the nanoporous stamp allows infiltration of the ink solvent and resists and/or reduces deformation due to capillary forces; and (3) the nanoporous stamp is mechanically compliant and also durable, enabling uniform contact with the target substrate without buckling or yielding of the micro-scale features of the stamp.

Figure 2D:
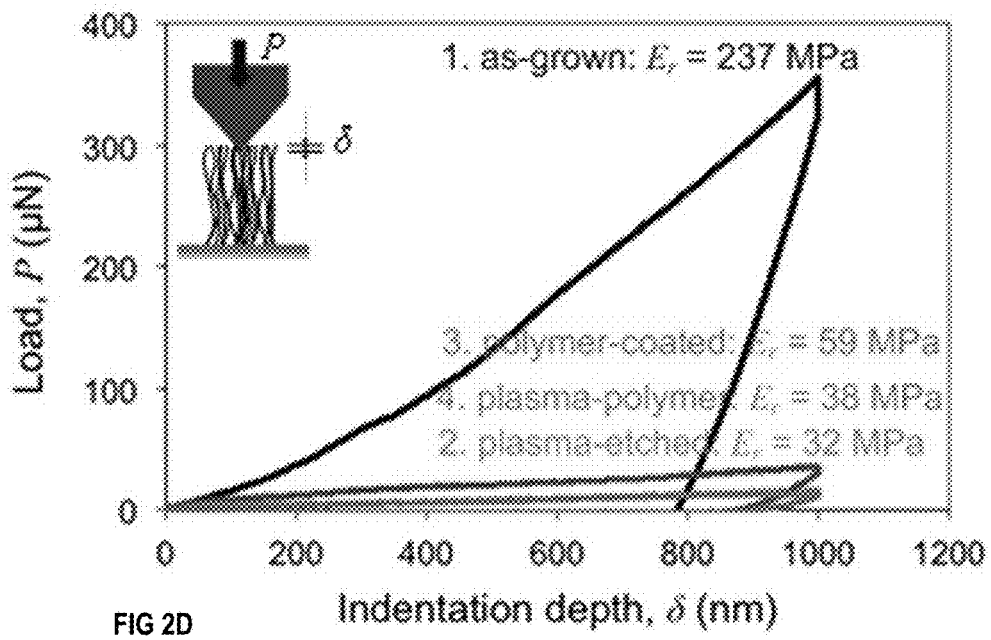
Figure 2E:
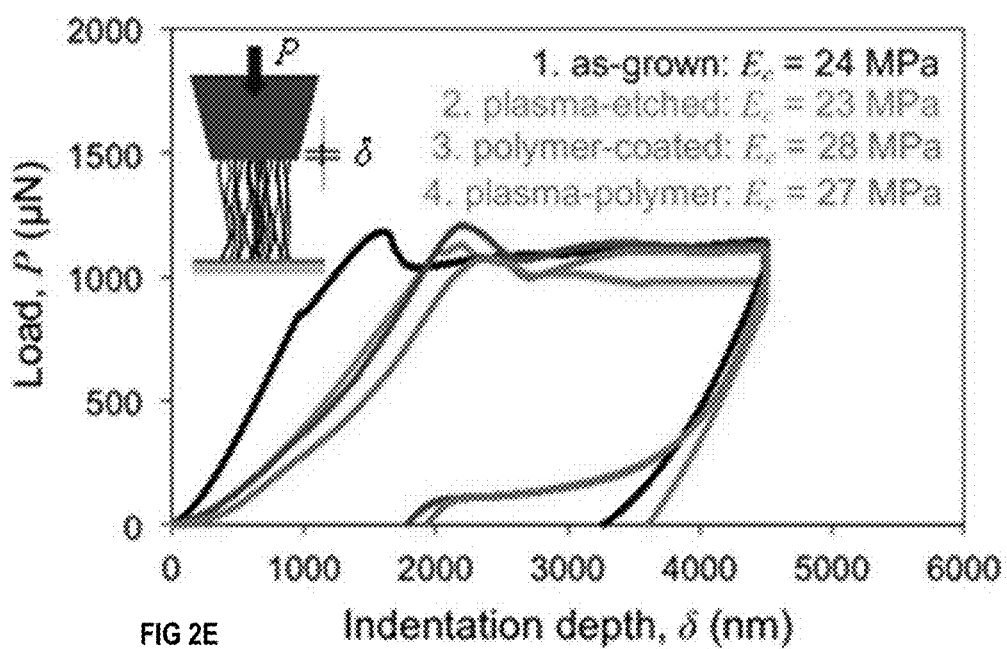

An exemplary nanoporous stamp fabrication procedure for one embodiment is shown in FIG. 2A, where a catalyst is applied to a substrate 205, CNTs are grown 210, etched 215 (e.g., by oxygen plasma etching), bonded 220 (e.g., by applying a polymer coating to form polymer coated CNTs), and then treated 225 (e.g., plasma treated) to remove any extraneous material from the bonding. Vertically aligned/substantially vertically aligned CNT arrays or forests are grown 210 on a substrate, such as a lithographically patterned substrate (e.g., silicon substrates). In the example drawings, the CNT array is grown 210 by chemical vapor deposition (CVD) at atmospheric pressure. In some embodiments, the cross-sectional shape of the stamp features is determined by the growth catalyst pattern such that, within the dimensional limits of the methods used (e.g., photolithography) and the CNT forest growth process, a nanoporous stamp with desired feature shape can be fabricated. FIG. 2B shows magnified SEM images of the top and side of a 100 μm diameter micropillar for one implementation at each stage of the process shown in FIG. 2A, and FIG. 2C shows optical images of the wetting/dewetting behavior after each stage (~10 μL water droplet). FIG. 2D and FIG. 2E provide load-displacement curves obtained using a 1 μm radius conical tip and a flat tip, respectively, to measure the surface modulus and the overall elastic modulus in compression for the illustrated example implementation. The processes and materials detailed in the following publications, each of which is herein incorporated by reference in its entirety, can also be adapted and applied to the present disclosure: A. J. Hart and A. H. Slocum, "Rapid growth and flow-mediated nucleation of millimeter-scale aligned carbon nanotube structures from a thin-film catalyst," Journal of Physical Chemistry B, vol. 110, pp. 8250-8257 (2006); and S. Tawfick, X. Deng, A. J. Hart and J. Lahann, "Nanocomposite microstructures with tunable mechanical and chemical properties," Physical Chemistry Chemical Physics, vol. 12, pp. 4446-4451 (2010).

As a structure, CNT arrays according to some embodiments are highly porous (e.g., ~99% porosity) and mechanically compliant (e.g., compressive modulus ranging from 5 MPa to 100 MPa). In some embodiments, the mechanical behavior of such CNT arrays can be similar to that of open-cell foams when compressed to moderate strains. According to some embodiments, the modulus of the nanoporous stamp and/or CNT arrays can be tuned over a wide range based on the diameter, density, and connectivity of the CNTs, for example, by adapting the methods detailed in the following publications: Brieland-Shoultz, A., Tawfick, S., Park, S. J., Bedewy, M., Maschmann, M. R., Baur, J. W. and Hart, A. J., Scaling the Stiffness, Strength, and Toughness of Ceramic-Coated Nanotube Foams into the Structural Regime. Adv. Funct. Mater., 24: 5728-5735 (2014); P. D. Bradford, X. Wang, H. Zhao and Y. T. Zhu, "Tuning the compressive mechanical properties of carbon nanotube foam," Carbon, vol. 49, pp. 2834-2841 (2011); and O. Yaglioglu, A. Cao, A. J. Hart, R. Martens and A. H. Slocum, "Wide range control of microstructure and mechanical properties of carbon nanotube forests: a comparison between fixed and floating catalyst CVD techniques," Advanced Functional Materials, vol. 22, no. 23, pp. 5028-5037 (2012); the entirety of each of the aforementioned publications is herein expressly incorporated by reference.

Figure 2F:
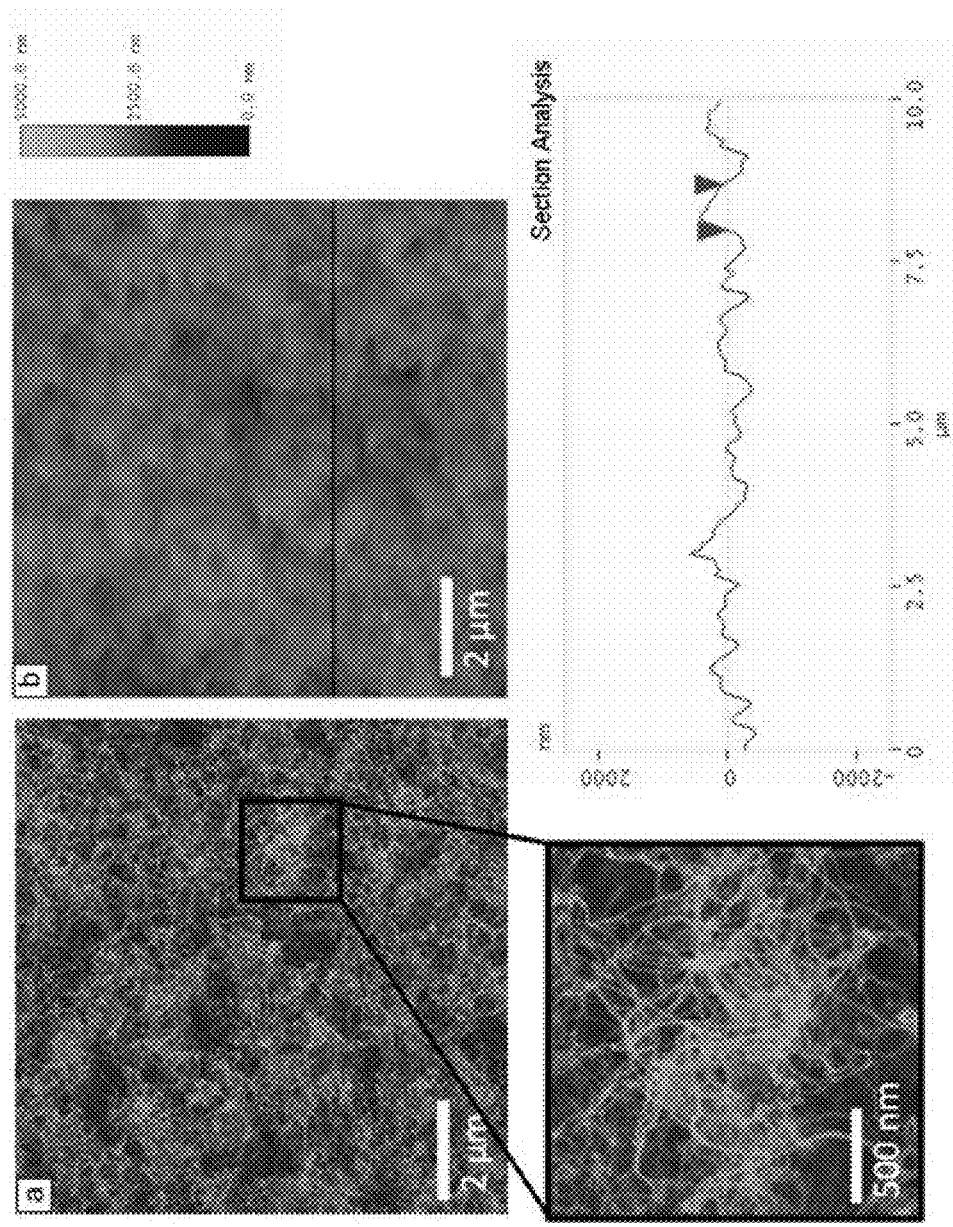
FIG. 2F provides enhanced images of the top surface of an example CNT forest microstructure.
Figure 2G:
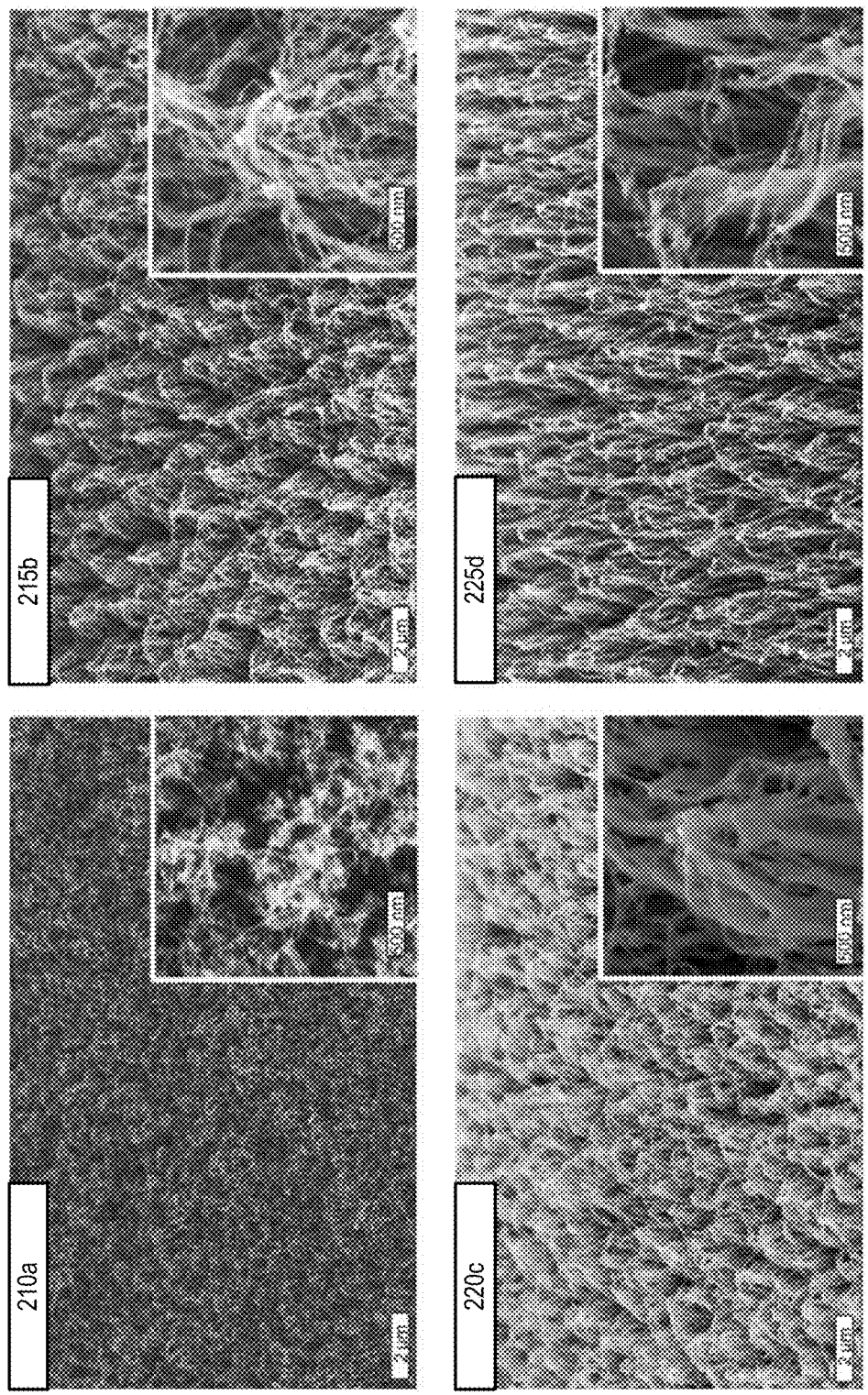
FIG. 2G provides images of a top surface of a CNT microstructure as grown, after etching using oxygen plasma, after conformal coating, and after subsequent oxygen plasma etching, according to some embodiments.

According to some embodiments, the top surface (i.e., surface distal to the substrate) of the as-grown CNT microstructures comprises clusters of tangled CNTs arising from the CNT self-organization process. These clusters can be stiff and rough, such that in some implementations, the clusters result in non-uniform contact against the target substrate. FIG. 2F provides scanning electron microscopy (SEM) and atomic force microscopy (AFM) images of the top surface of a CNT forest microstructure (as-grown). For the provided example, the rms roughness determined by AFM is approximately ~100 nm. Indentation tests with a sharp (10 μm conical) tip and compression tests with a flat tip, shown in FIGS. 2d and 2e respectively, reveal that the surface modulus (~240 MPa) of as-grown CNT arrays is much greater than the compressive modulus (~24 MPa). Accordingly, to facilitate micrometer-resolution ink transfer, the clusters can be removed 215, for example, via etching (e.g., oxygen plasma etching), eliminating the tangled surface layer of the CNT forest (FIGS. 2b and 2G), such that the surface modulus (~32 MPa) is comparable to the compressive modulus. FIG. 2G provides SEM images of the top surface of a circular (100 μm diameter) CNT microstructure at each fabrication stage shown in FIG. 2a: as grown 210a, after etching 215b using oxygen plasma, after conformal coating 220c with p(PFDA), and after subsequent treatment 225d via oxygen plasma etching.

The appropriate surface compliance enables the microstructure to conformally contact a target substrate during printing, enabling uniform ink transfer with nanoscale thickness and high uniformity. According to some embodiments, the surface chemistry of the CNTs can be engineered to enable infiltration of the ink and to reduce or prevent elastocapillary densification of the CNT microstructures, e.g., like that shown in 212 of FIG. 2C. For example, a CNT forest synthesized by CVD may be hydrophobic, and subsequent oxygen plasma etching may create surface defects and promote attachment of oxygen-containing surface groups, thereby rendering the CNT forest hydrophilic. Thus, CNT microstructures may shrink slightly when infiltrated with liquid, and the capillary force exerted by the contracting meniscus during evaporation can overcome the elastic restoring forces of the deformed tubes, causing significant elastocapillary densification and mechanical damage.

In some embodiments, the CNTs may be bonded or reinforced to prevent capillary-induced deformation of the CNT microstructures while retaining the desired porosity. In some implementations, the CNTs may be coated with a conformal coating, such as thin layer of a polymer. The surface wettability or adhesive energy of the nanoporous stamp can, in some embodiments, be tuned or configured by selecting appropriate coating material(s). For example, a polymer coating can be applied to or disposed on the nanotubes, and the polymer coating forms bonds between at least a portion of the nanotubes. One or more polymers can be selected based on the particular implementation where utilized, and can include one or more of the following: a fluoropolymer, a polyacrylate, a polyfluoroacrylate, and/or a polyperfluorodecylacrylate. Additional exemplary polymers can include, depending on the embodiment and by way of non-limiting example: dimethylaminomethyl)styrene (DMAMS); (2-hydroxyethyl) methacrylate (HEMA); 1-vinyl-2-pyrrolidone (VP); ethylene glycol diacrylate (EGDA); trivinyltrimethylcyclotrisiloxane (V3D3); methacrylic acid (MAA); ethlacrylate; and/or glycidyl methacrylate (GMA).

A conformal coating can reduce capillary-induced deformation of CNTs. Further, using a coating material with a high dielectric constant allows additional control of wettability by electrostatic forces applying electrical potential into individual CNTs.

Figure 2H:
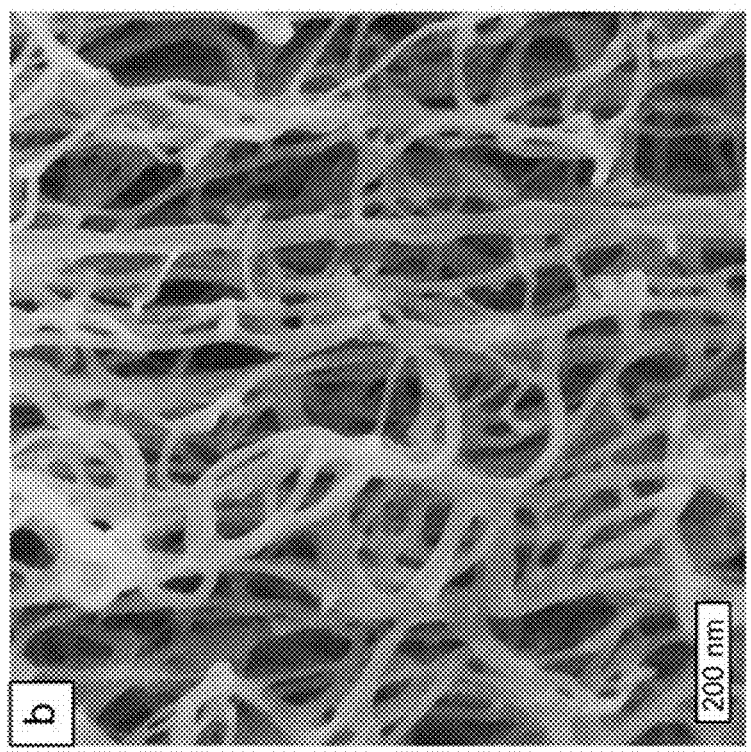
FIGS. 2H and 2I provide images and structural detail for individual CNTs in a microstructure before and after polymer coating and treatment, according to some embodiments.
Figure 2H:
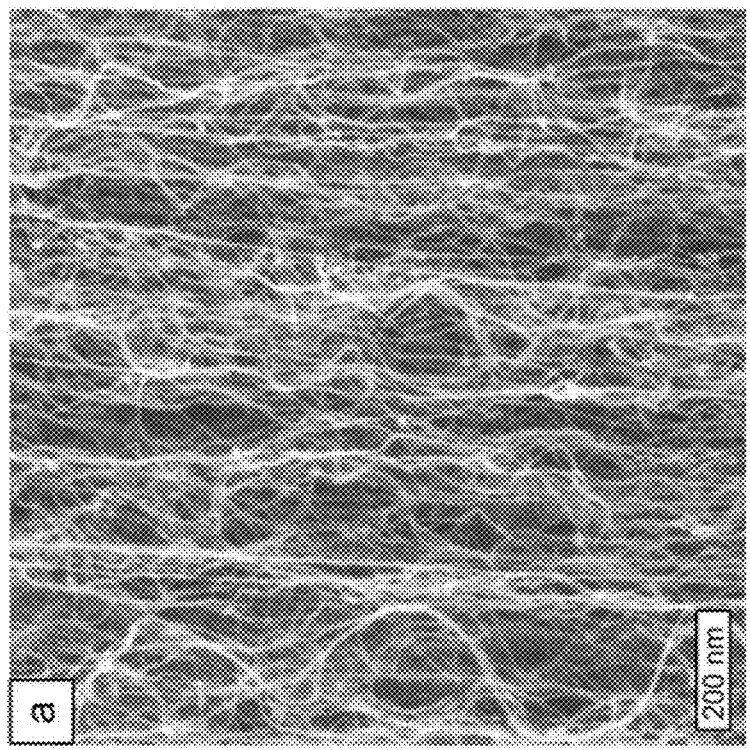
Figure 2I:
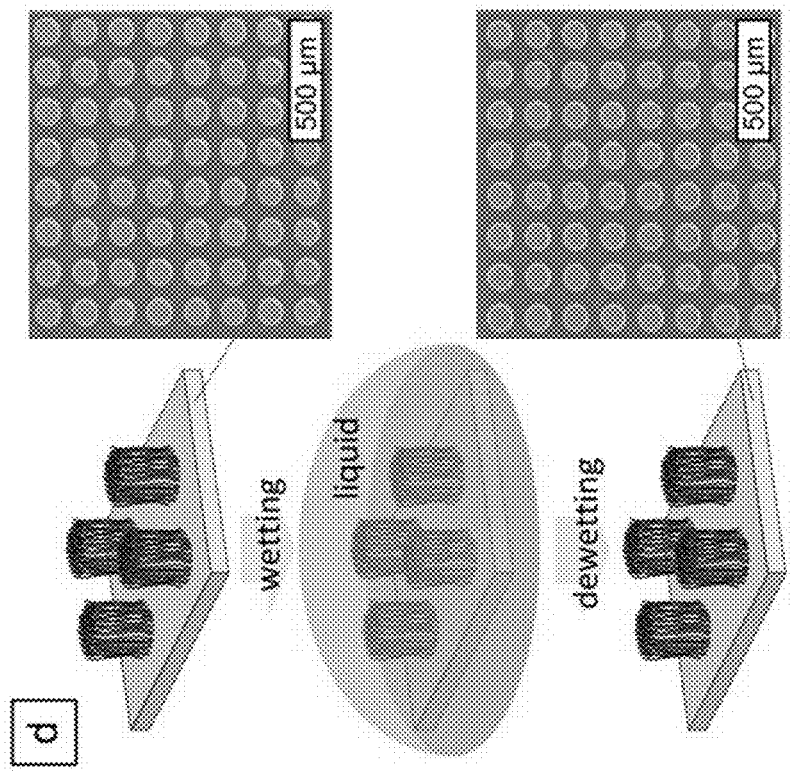
Figure 2I:
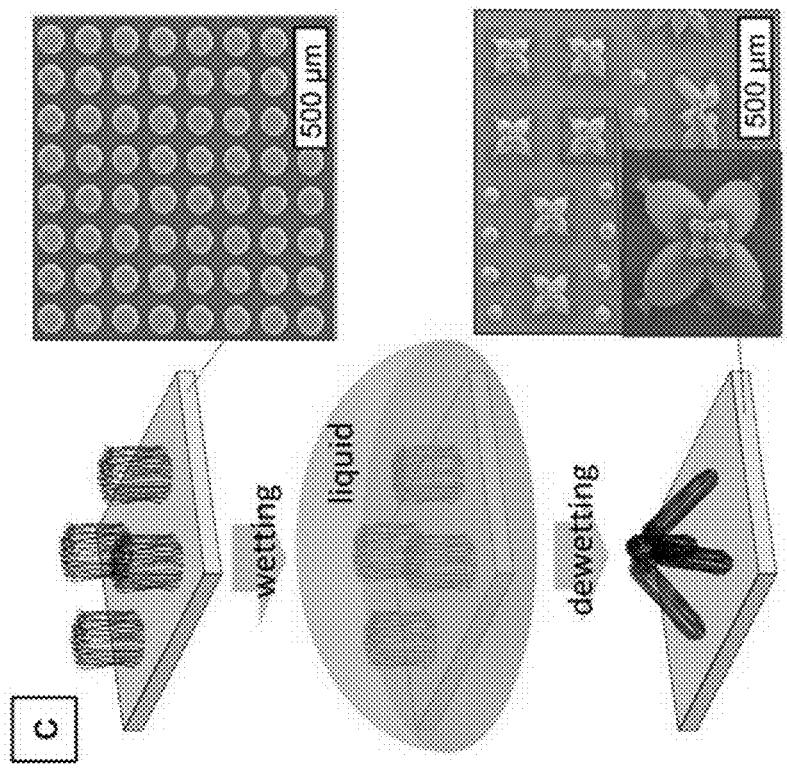

By way of example, in one embodiment, the CNTs can be coated with a thin layer (e.g., ~20 nm to ~30 nm) of poly-perfluorodecylacrylate, p(PFDA), using iCVD. The PFDA monomer diffuses into the porous CNT microstructures in the vapor phase and results in a conformal coating of the CNTs, as shown in FIG. 2b and image 220c of FIG. 2G. In this example, the iCVD polymer coating is followed by a second oxygen plasma treatment 225 to remove any pPFDA deposited in a nonconformal manner as a result condensation the monomer at the tip of the CNT forest. The pPFDA-coated CNT microstructures do not shrink substantially or collapse upon liquid infiltration and solvent evaporation. FIG. 2H shows a magnified view of SEM images of individual carbon nanotubes in a microstructure before (a) and after (b) iCVD coating of poly-perfluorodecylacrylate, p(PFDA). FIG. 2I provides example schematics and observed SEM images of CNT microstructures that were plasma-etched (c) and plasma-etched then p(PFDA)-coated (d) CNT microstructures, and then subsequently immersed in water.

Figure 2J:
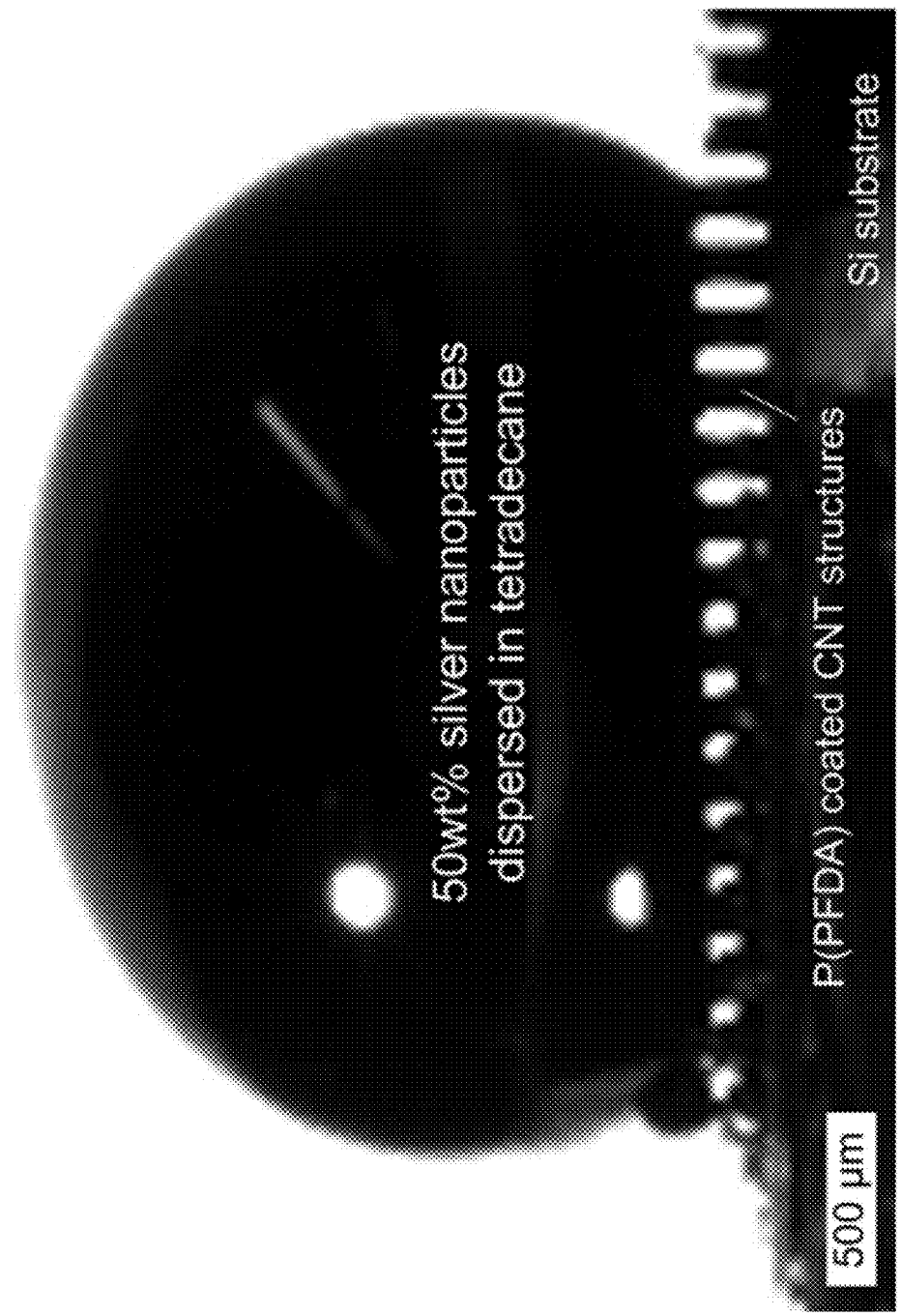
FIG. 2J is an image of a silver nanoparticle ink droplet on an example array of CNT pillars coated with poly-perfluorodecylacrylate, p(PFDA), prior to a second plasma treatment, according to one implementation.

A second treatment (e.g., plasma treatment) can assist or enable ink infiltration for printing, as illustrated by FIG. 2J which provides an optical image of a silver nanoparticle ink droplet (<10 nm, 50-60 wt % dispersed in tetradecane) on an array of 100 μm diameter CNT pillars coated with poly-perfluorodecylacrylate, p(PFDA), prior to a second plasma treatment. In this example, the surface modulus and uniaxial compressive modulus of the coated CNT microstructures are 38 MPa and 27 MPa, respectively, corresponding to a 10-20% increase due to the polymer coating. The conformal coating increases resistance to elastocapillary densification via reinforcing individual CNTs and/or forming nanowelds at CNT-CNT contact point. In the example, the pFDA coating increases resistance to elastocapillary densification by reinforcement of individual CNTs by the pPFDA coating as well as formation of pPFDA nanowelds at CNT-CNT contact points.

III. HIGH-RESOLUTION PRINTING VIA CONTROLLED NANOSCALE INK TRANSFER

The nanoporous stamp can be used for a variety of printing applications. According to some embodiments, to achieve uniform or substantially uniform ink transfer from the nanoporous stamp the target substrate, the wet stamp contacts the substrate uniformly (or substantially uniformly) while retaining the ink within the bounds of the stamp features. By contrast, the ink in traditional relief or flexographic printing is retained on the top surface of non-porous stamp structures, and the ink volume in gravure printing is determined by the cavities on the transfer roller.

Figure 3A:
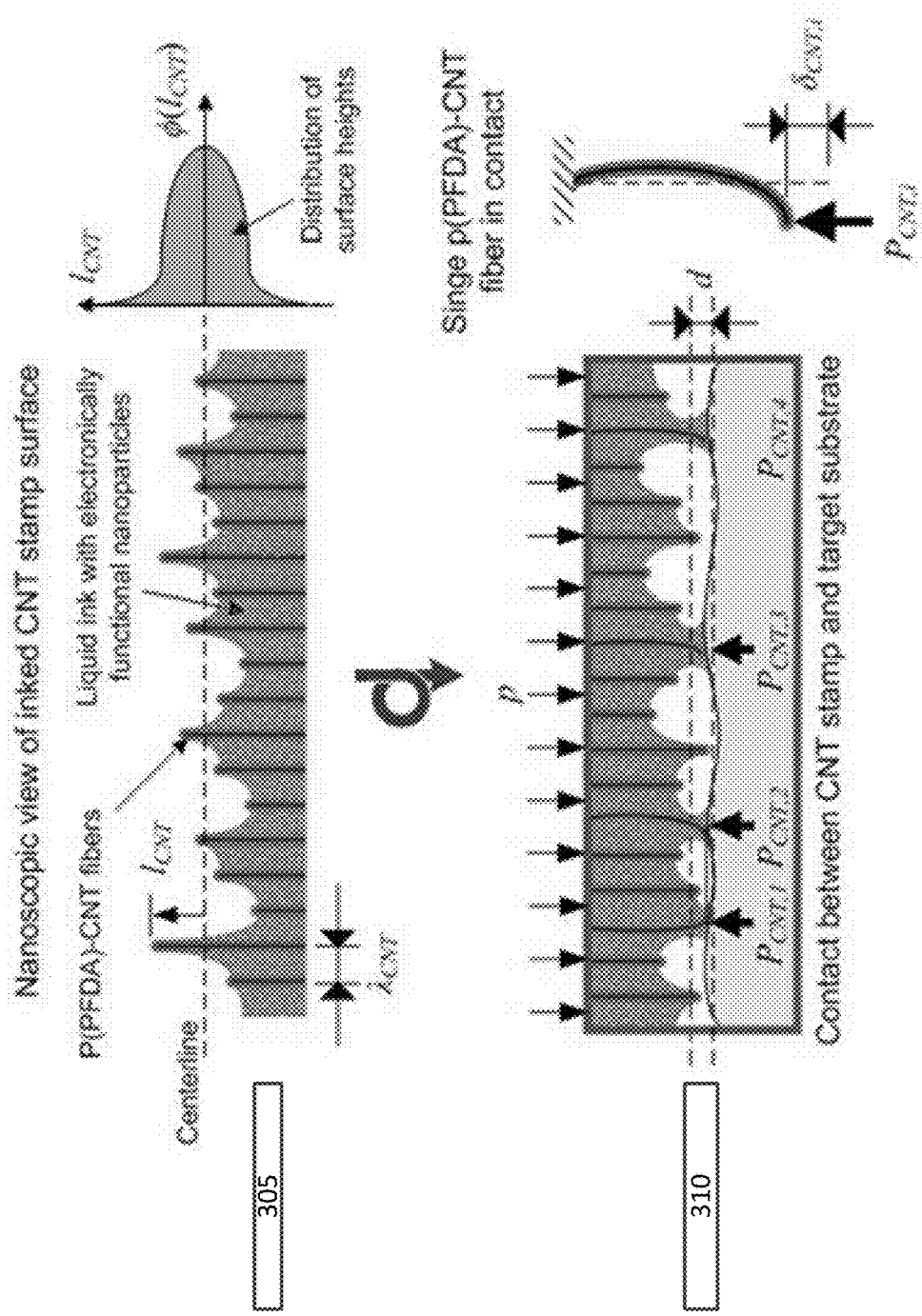
FIG. 3A illustrates a schematic of nanoscopic view of CNT stamp surface after loading with ink and of contact between inked CNT stamp and target substrate surface.

FIG. 3A illustrates a nanoscopic (not to scale) view of an inked nanoporous CNT stamp surface after loading with ink 305 and of contact between the inked nanoporous CNT stamp and a target substrate surface 310 according to an exemplary embodiment. The top surface of a stamp microstructure with well-confined ink comprises the free surface (>90%) held by the network of polymer-coated CNTs (10-50 nm diameter, ~100 nm spacing). Intrinsic height variance of the CNT network (~10-100 nm) can cause roughness of the free surface where the ink is pinned to the tips of the coated CNTs. According to some embodiments, when the stamp is brought into contact 310, the compliance of the CNT tips allows the stamp to conform to the roughness of the target substrate at moderate pressure. Increased contact pressure ensures conformal contact and drives the confined ink to wet the target surface more uniformly. As discussed below, the pressure is controlled to reduce or prevent overprinting (i.e., loss of fidelity) and/or failure of the stamp by buckling.

To determine the appropriate pressure for conformal contact that results in uniform ink transfer according to some embodiments, the disclosure provides a mechanical model of the compliance of the stamp surface. By way of illustration, as discussed above, the disclosure utilizes p(PFDA)-CNT fibers, but it is to be understood that this is non-limiting and can be applied more broadly. Based on assuming the tips of the CNTs have normally distributed positions ($l_{CNT}$) with a standard deviation of $\sigma_l$ relative to a nominal plane, the probability density of the surface heights can be determined as $$\phi(l_{CNT}) = \frac{1}{\sigma_l\sqrt{2\pi}}\exp\left(-\frac{l_{CNT}^2}{2\sigma_l^2}\right) \quad (1)$$

Additionally, when two surfaces are in contact at a distance (d) (e.g., the distance between two nominal or center planes), the contact pressure (p) within the contact area (A) is supported by the coated-CNT (e.g., p(PFDA)-CNT) fibers in contact, which can be given a $$\begin{aligned}p &= \frac{1}{A}\sum_i^{n_c} P_{CNT,i} \\ &= \frac{1}{A}\sum_i^{n_c} k_{CNT}\delta_{CNT,i} \\ &= \frac{n}{A}\int_d^{\infty} k_{CNT}(l_{CNT}-d)\cdot\phi(l_{CNT})\,dl_{CNT} \\ &= \frac{k_{CNT}\sigma_l}{\sqrt{2\pi}\lambda_{CNT}^2}\cdot\left[\exp\left(-\frac{d^2}{2\sigma_l^2}\right) - \sqrt{\frac{\pi}{2}}\frac{d}{\sigma_l}\left\{1-\text{erf}\frac{d}{\sqrt{2}\sigma_l}\right\}\right]\end{aligned} \quad (2)$$

where $P_{CNT,i}$ is the load supported by i-th p(PFDA)-CNT fiber in contact, $n_c$ is the number of fibers in contact, n is the total number of fibers on the stamp surface ($\cong A/\lambda_{CNT}^2$), $k_{CNT}$ is the stiffness of a single p(PFDA)-CNT fiber, $\delta_{CNT,i}$ is the deformation distance of i-th fiber in contact ($=l_{CNT,i}-d$), and $\lambda_{CNT}$ is the average spacing between the fibers. Moreover, the contact ratio at the given distance d will be $$\frac{n_c}{n} = \int_d^{\infty}\phi(l_{CNT})\,dl_{CNT} = \frac{1}{2}\left\{1-\text{erf}\left(\frac{d}{\sqrt{2}\sigma_l}\right)\right\} \quad (3)$$

Thus, for some embodiments, the contact ratio can be determined by the contact pressure, stiffness (surface compliance), surface height variation and spacing of the CNT fibers. However, it is to be understood that additional considerations may also be utilized in the determination according to the present disclosure. For example, the surface tension force on the force-displacement profile and/or the shape of the free surface may also be utilized, along with other factors such as elastic deformation, viscous effects of ink, target substrate roughness, and/or the like.

Figure 3B:
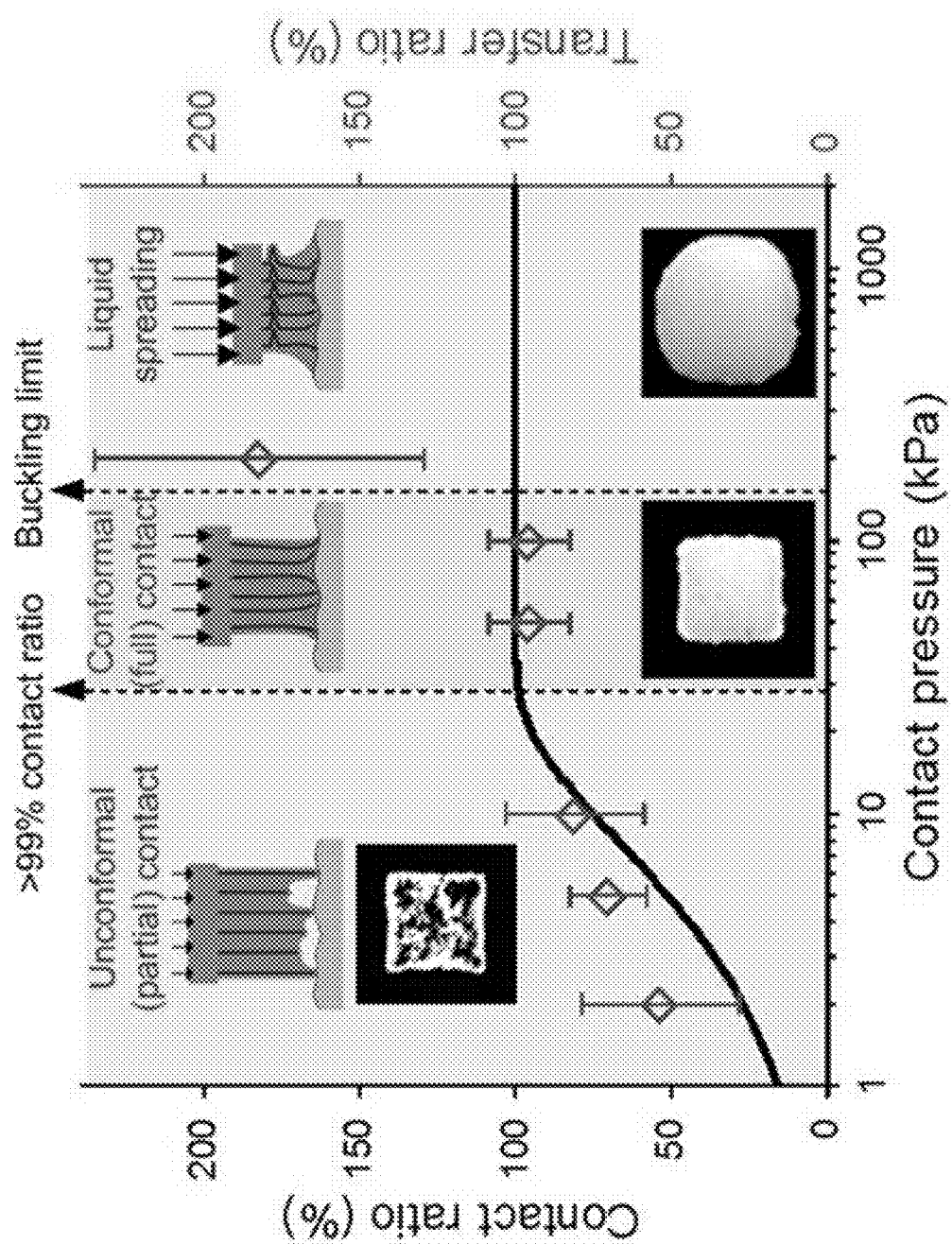
FIG. 3B provides a graph illustrating a ratio of contact between CNT surface fibers and target substrate, and ratio of silver nanoparticle ink transferred on a glass substrate according to contact pressure for an exemplary implementation.

The contact ratio for a nanoporous stamp (e.g., as determined for the CNT nanoporous stamp above) can be utilized to determine the appropriate applied pressure for uniform ink transfer according to the disclosure. FIG. 3b shows a predicted relationship between contact ratio and pressure for an exemplary CNT stamp (e.g., having $k_{CNT}$ ~2.7 mN/m, $\sigma_f$~50 nm, and $\lambda_{CNT}$~100 nm), where the required contact pressure for the CNT stamp to conformally contact the target substrate (>99% contact ratio) is estimated to be ~28 kPa. The ratio of contact between CNT surface fibers and target substrate (black solid line; contact model shown in Eq. (2) and Eq. (3)) and ratio of silver nanoparticle ink transferred on a glass substrate (gray points and error bars; experimental results) according to contact pressure.

Importantly, without plasma etching of the surface layer 225, conformal surface contact cannot be achieved at contact pressure lower than the buckling limit of the coated CNT forest (~150 kPa). The model was validated by measuring the relationship between applied pressure and the ink transfer ratio, defined as the area of silver nanoparticle ink printed on a glass substrate (rms roughness ~2 nm) divided by the area of the stamp pattern. For one embodiment, at lower pressure (<28 kPa), incomplete transfer is observed within each microscale stamp feature. At moderate pressure (28-150 kPa), the printed features match the stamp patterns, indicating that contact is uniform. At high pressure (>150 kPa), the p(PFDA)-CNT fibers, overprinting is observed where the size of the printed features exceeds the stamp feature sizes, and there is a significant loss of shape fidelity. High pressures result in excessive deformation of the nanoporous stamp surface and/or buckling of the CNT features and forces excessive ink onto the substrate where it spreads laterally outward from the contact area.

Figure 3C:
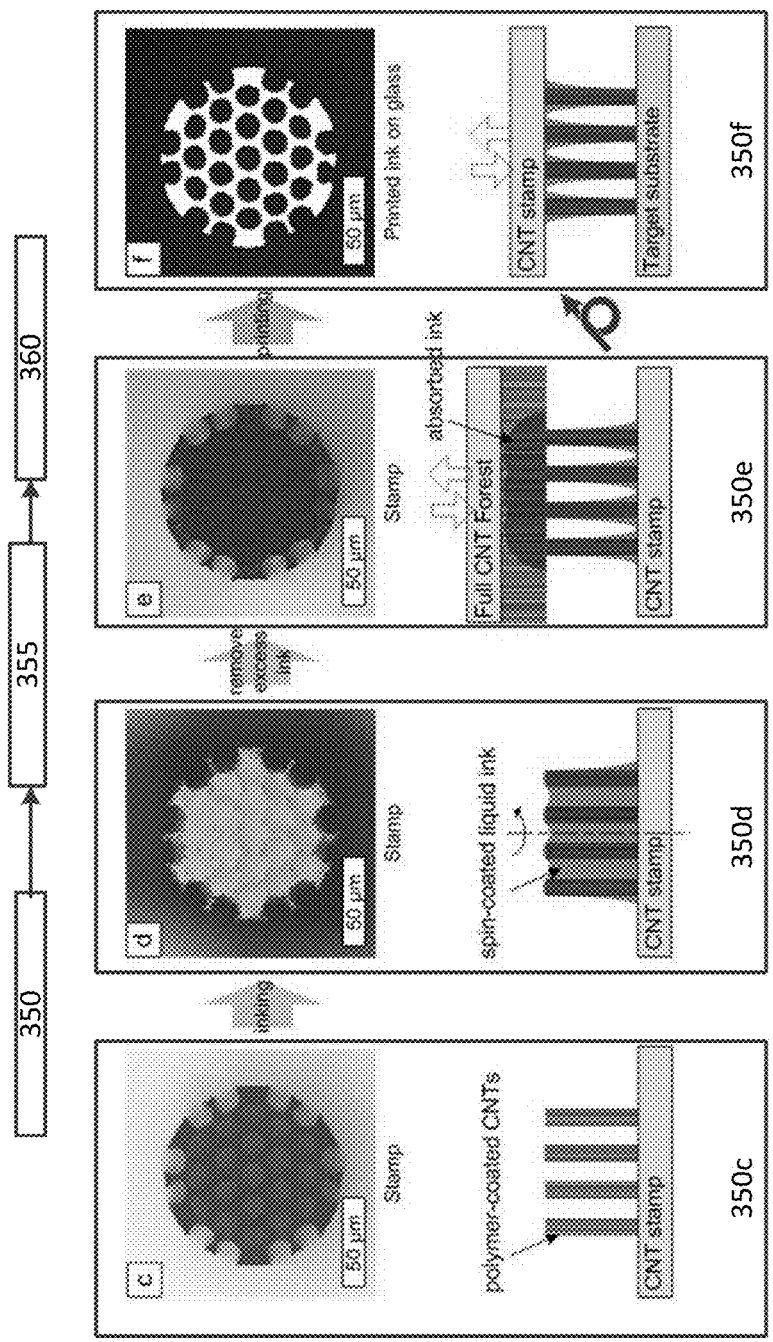
FIGS. 3C-3D illustrate methods for ink loading and printing with corresponding exemplary images, according to some embodiments.

According to some embodiments, resolution and fidelity (e.g., edge roughness, corner radius, etc.) of printed features is controlled by stamp preparation (e.g., CNT microstructure geometry, surface roughness, mechanical properties, print/pattern size, surface treatment, and/or the like), the inking process, and the magnitude and uniformity of the contact pressure. An exemplary method for ink loading and printing to achieve micrometer and submicrometer resolution printing is illustrated in FIG. 3C, which provides optical microscope images (top) and schematics (bottom, not to scale) of an engineered CNT stamp feature, fabricated as discussed above, having a honeycomb structure with 3 μm minimum internal linewidth 350c, after spin-coating of ink 350d, after removal of the excess ink by contact against a non-patterned CNT forest 350e, and the resulting printed pattern on a glass substrate 350f.

Figure 3D:
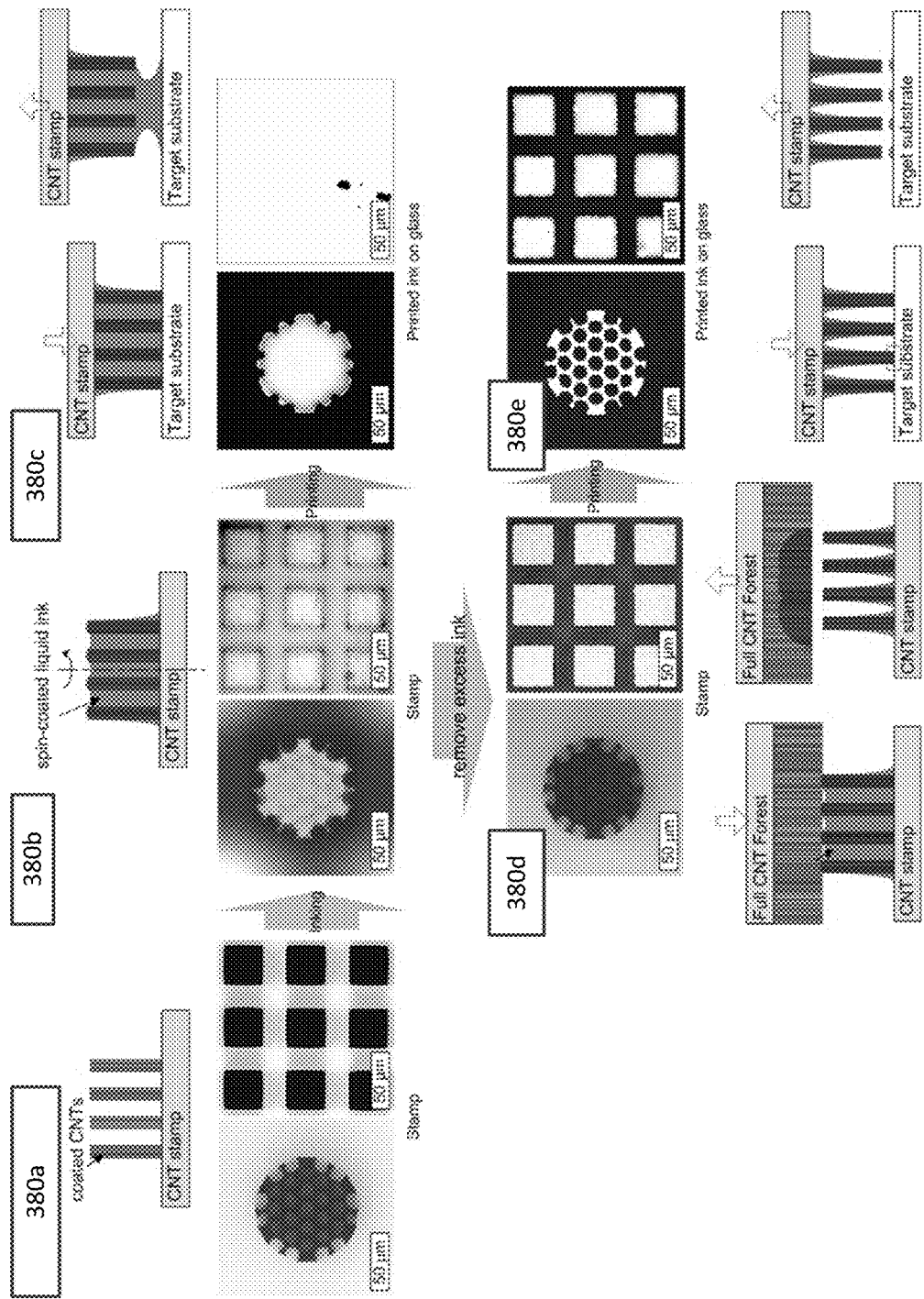

In this and other implementations, colloidal ink is applied to the stamp 350 (e.g., by spin coating) where the ink is drawn into the CNT microstructures by capillary wicking. In some implementations where ink is loaded by spin coating, some of the excess ink can be removed from the stamp by the centrifugal forces during the spinning process. However, this disclosure provides for removing additional excess ink to provide improved resolution that can be applied with limitation to the method of loading the ink. In the illustrated implementation, excess ink present on top of the microstructures and in the gaps between the microstructures. When such a stamp is used to print, the excess ink on the top spreads and the ink in the gaps touch the target substrates, resulting in greater width and corner roundness of the stamp features, and may even cause ink transfer onto undesired surfaces. FIG. 3D provides an example schematics and optical microscope images of engineered CNT stamps 380a having fine features (<10 μm linewidth and corner radius), inked stamp features after spin-coating of the Ag colloidal solution 380b; the resulting printed pattern on glass using this stamp 380c; the inked stamp feature after spin-coating followed by removal of excess ink by contacting a full CNT forest 380d; and the resulting printed pattern using the stamp after removal of the excess 380e.

To overcome this issue, some methods according to this disclosure include contacting the wet stamp with another nanoporous surface 355, such as non-patterned, plasma-treated CNT forest 350e. The non-patterned forest or other nanoporous surface (or nanoporous scour), which is porous and wettable by the ink, draws the excess ink from the nanoporous stamp surface while leaving the stamp features filled and ready for printing. Thereafter, when the inked nanoporous stamp is used for printing 360, uniform (or substantially uniform) ink transfer is achieved 350f. Such printing utilizes formation of nanoscale contact points across the surface of each micro-scale stamp feature, and replicates the shapes of the stamp features with high accuracy when the appropriate moderate pressure is applied. Depending on the embodiment, the porosity and/or other surface features of the nanoporous scour used to remove excess ink from the nanoporous stamp can be adjusted for the application where the nanoporous stamp is being used. In some implementations, slight differences between properties of the stamp and the scour may be desired, and the stamp nanoporous surface and scour nanoporous surface configured accordingly. For many applications, the nanoporous scour may be the same or essential the same as the nanoporous stamp such that the respective porosities (and associated wicking) are the same or substantially the same. This may be achieved, for example, by fabricating the stamp and the scour at the same time and/or according to the same method, but where the scour is not patterned (and/or not patterned in the same regions such that the scour removes excess ink as required from the stamp). In some embodiments, the method of ink loading may reduce or eliminate the need for use of a scour, for example, if the print stamp is loaded with ink via inkjet printing.

Figure 3E:
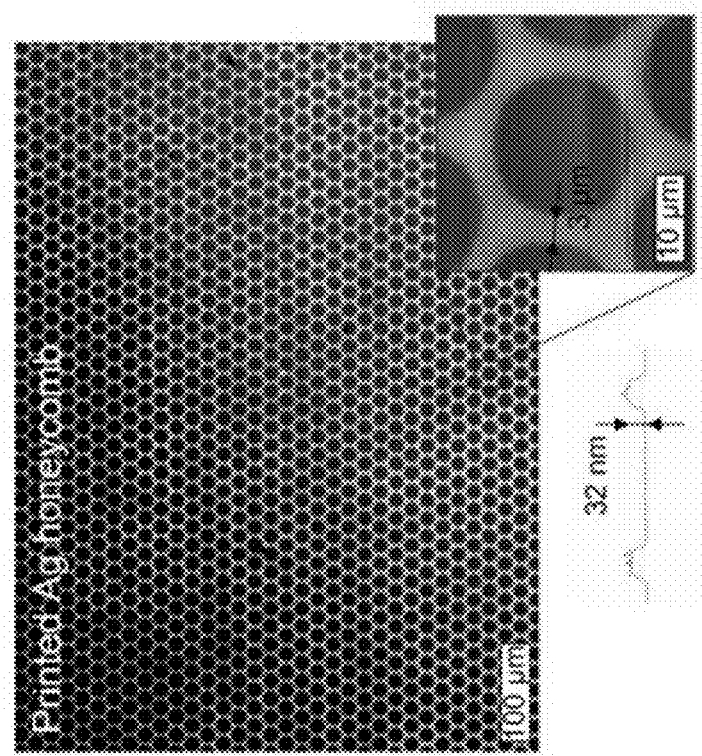
FIG. 3E provides images illustrating nanoporous stamp features for an exemplary nanoporous stamp and resulting printed patterns using the nanoporous stamp, according to some embodiments.
Figure 3E:
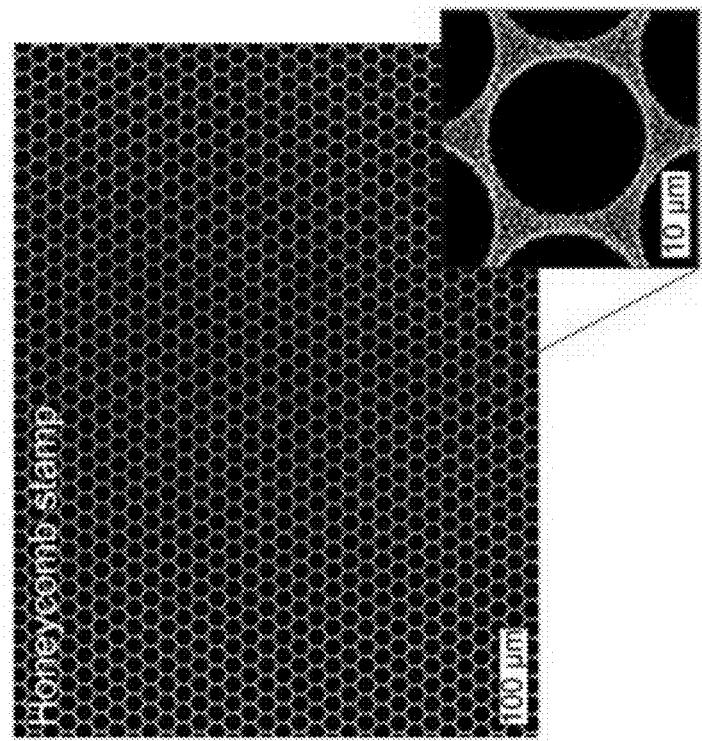

The example provided by FIG. 1D illustrates using the method described above, where arrays of squares are printed having 25 μm side length, 10 μm spacing, and 3 μm corner radius. This square pattern in this example corresponds to ~720 dpi, and can be utilized for patterning in a variety of applications, such as patterning sub-pixels for 'retina' displays. According to some embodiments, the roughness can be determined by the approximate spacing of coated CNTs along the edge of the microstructures. A variety of patterns, such as large-area 'honeycomb' patterns, can be printed directly. FIG. 3E provides SEM images of stamp features comprising an array of honeycombs, and optical and AFM images or resulting printed silver ink patterns using the stamp, the pattern having 3 μm minimum linewidth between each hole. The printed patterns have a line edge roughness of 0.2 μm, and a roughness of the circular holes of approximately 0.2 μm, significantly lower than those achieved by gravure methods (~2.0 μm).

The method of ink transfer using nanoporous stamps according to some embodiments of the disclosure can also be utilized to create ultrathin, uniform printed layers for a variety of applications. For example, printing of such thin, uniform layers can be utilized for fabricating electronic devices, such as thin film transistors, where a variety of materials are deposited and patterned in spatially registered layers. FIGS. 4A-4E show an example implementation according to one embodiment where, after evaporating the solvent, printed silver ink lines (~20 µm) exhibit uniform thickness of ~40 nm with surface roughness of only ~1.2 nm.

Figure 4A:
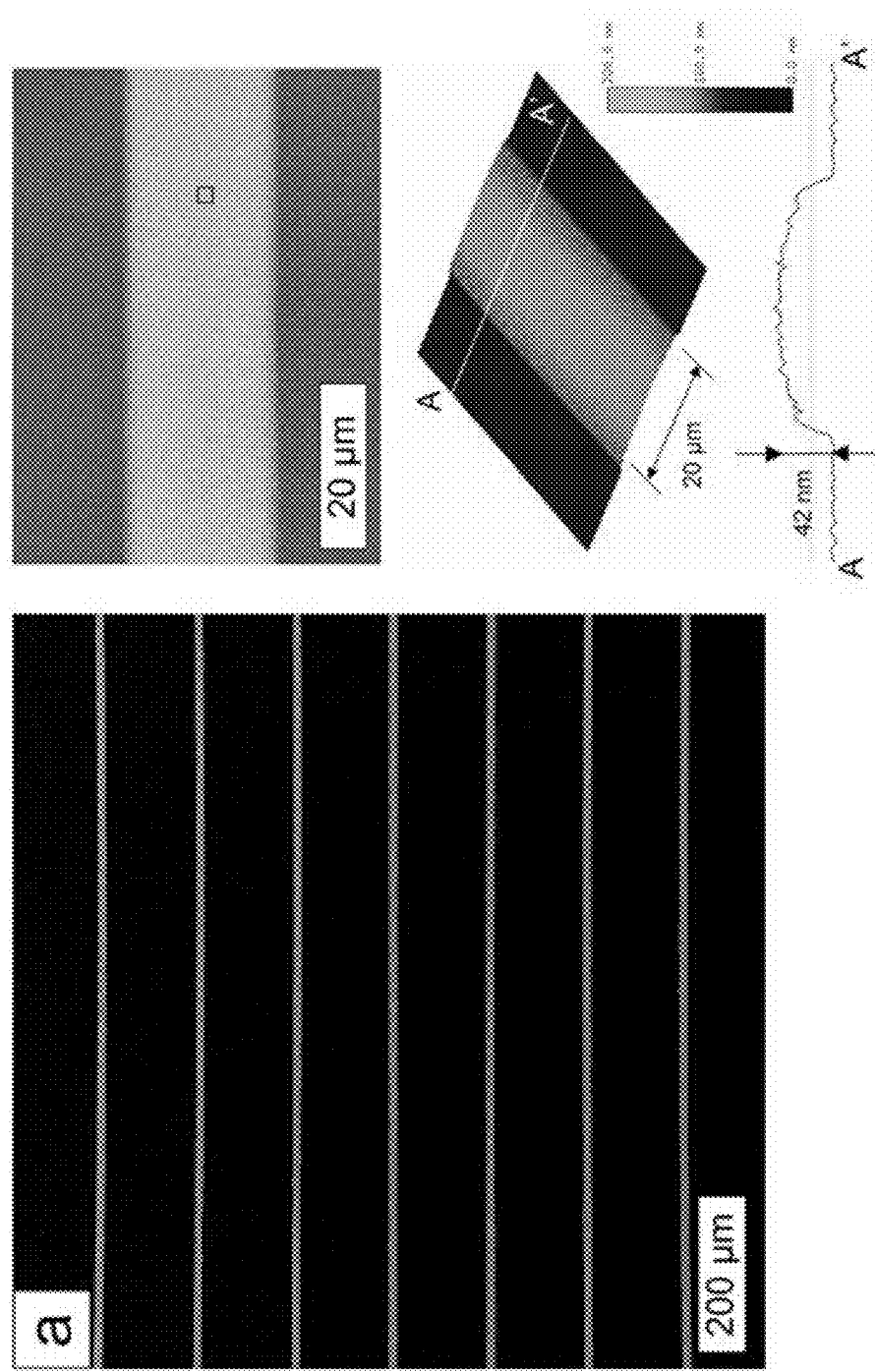
FIGS. 4A-4E illustrate properties of exemplary conductive ink patterns printed using nanoporous stamps according to some embodiments of the disclosure.
Figure 4B:
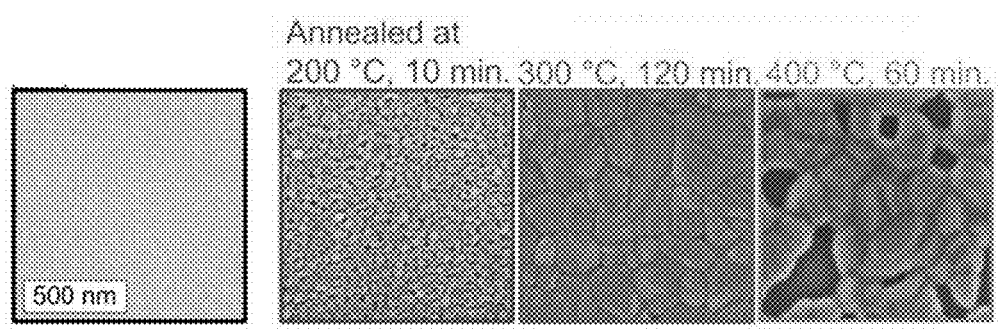
Figure 4C:
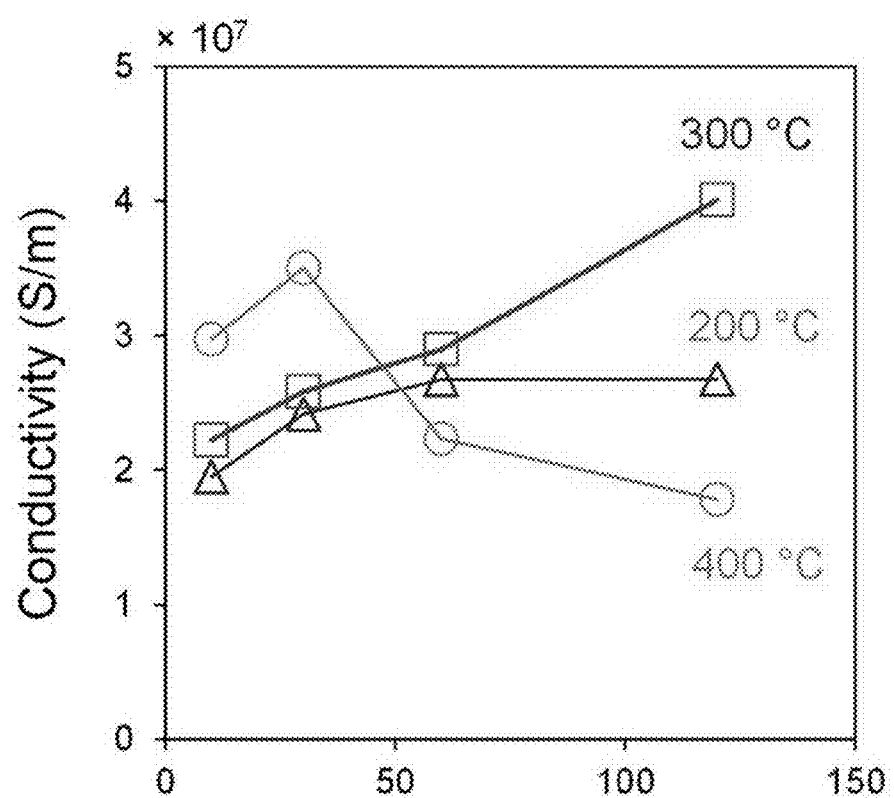
Figure 4D:
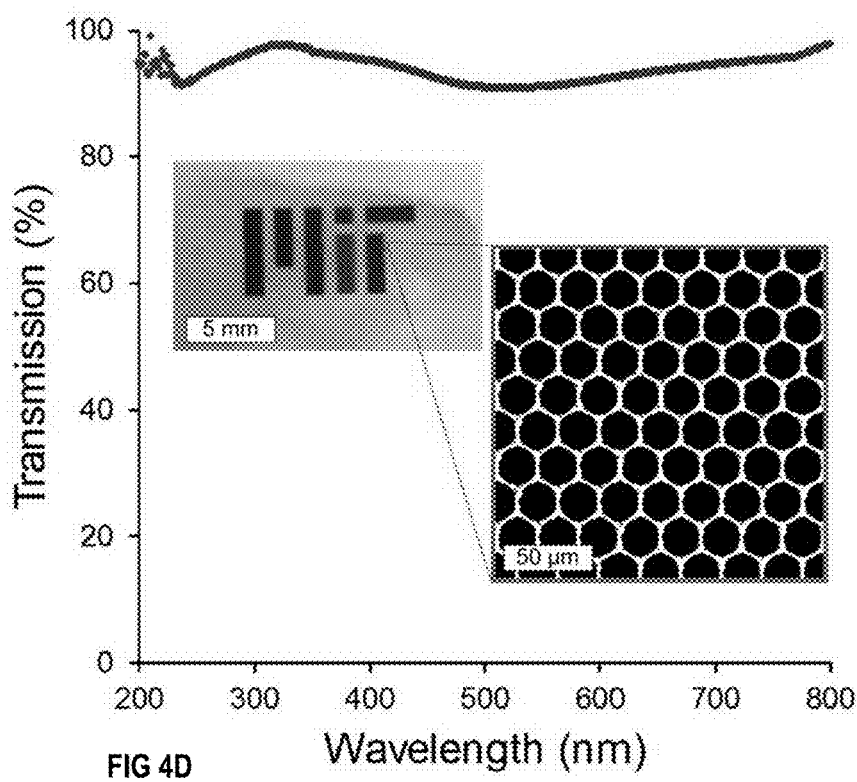
Figure 4E:
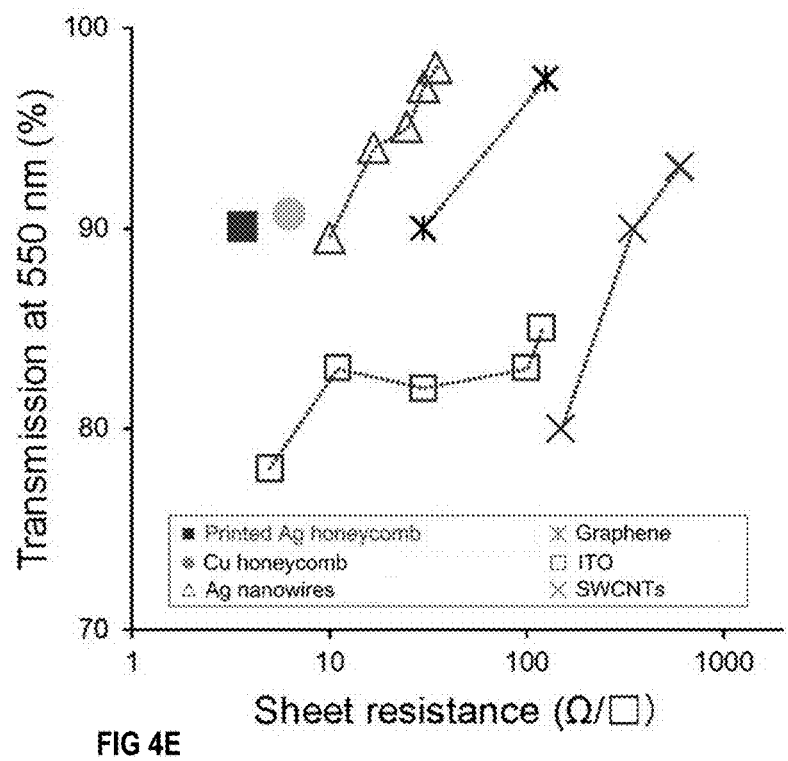
Figure 5:
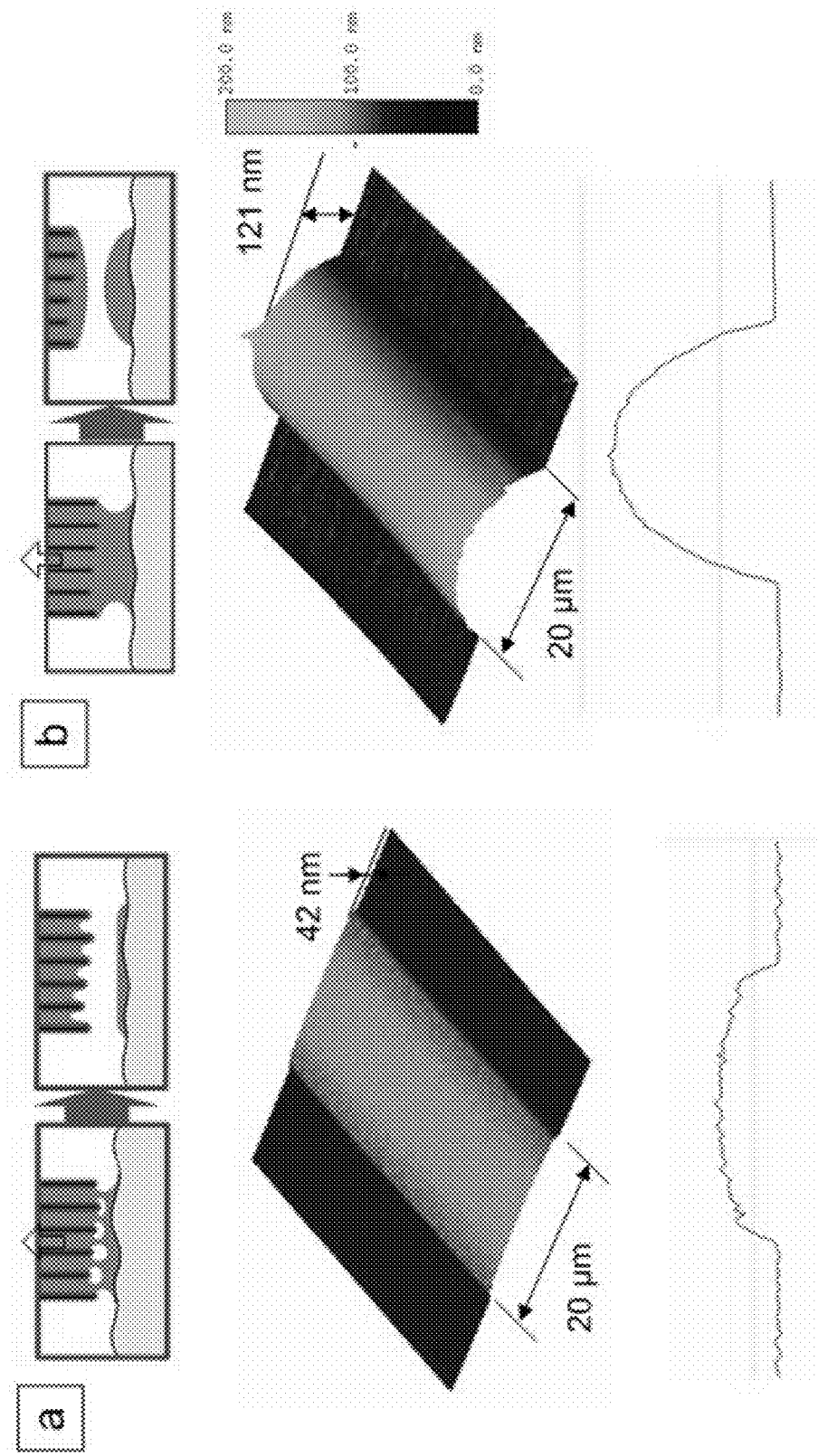
FIG. 5 provides exemplary images and structural details of a pattern printed using a stamp with controlled ink loading enabling nanoscale transfer, and with overloading of ink resulting in a non-uniform printed cross-section.

FIG. 4A provides SEM and AFM images of printed silver line array (20 µm line width, 200 µm pitch). FIG. 4B provides SEM images illustrating exemplary evolution of printed layer morphology after sintering at indicated times and temperatures, and FIG. 4C shows the corresponding conductivity values. FIG. 4D provides images and transmission spectrum of printed silver honeycomb pattern on a glass plate (22 µm hole diameter, 3 µm spacing). FIG. 4E charts the sheet resistance and transmission (at 550 nm) values of the exemplary silver honeycomb according to the disclosure, along with values for other transparent materials as reported in literature, including Cu honeycomb grids with Al-doped ZnO layer, silver nanowires, graphene, indium tin oxide (ITO), and single-walled carbon nanotubes. Unlike inkjet printing, printing according to embodiments of the disclosure do not exhibit the 'coffee ring' effect because the thin ink layer is printed with a relatively high solid content (e.g., 50-60 wt %) and because the contact line does not recede during solvent evaporation. As a result, the dimensions of the printed features closely match the stamp features. Such a uniformly thin profile is achievable when the amount of ink within the nanoporous stamp is controlled as disclosed herein. FIG. 5 provides AFM images and example (not to scale) schematics of lines printed using stamp with controlled ink loading (a) enabling nanoscale transfer, and with overloading of ink resulting in a non-uniform printed cross-section (b), as an illustrative example where excessive inking of the stamp results in non-uniform thickness of the printed layer, even at moderate applied pressure.

Further advantages of the disclosed methods and apparatuses are shown in how the disclosure translates to improvements in the performance of printed materials. The following example illustrates electrical properties of silver lines generated according to the disclosure. The silver lines were first annealed to form solid features from the printed nanoparticle layers. As shown in FIG. 4c, after annealing for 10 minutes at 200° C., the conductivity (measured across an array of lines, 20 µm wide with 200 µm pitch) reached $1.9 \times 10^7$ S/m, and after annealing for 120 minutes at 300° C., the conductivity increased to $4.0 \times 10^7$ S/m. These values represent approximately 30% and 60% of the conductivity of bulk silver ($6.3 \times 10^7$ S/m), respectively. SEM imaging shown in FIG. 4B illustrates how the nanoscale morphology of the printed features evolves during thermal annealing; at shorter times and lower temperatures, voids are present, while the highest conductivity is accompanied by a void-free nanocrystalline surface texture. If the annealing conditions are too aggressive, the resistivity rises due to the dewetting of the silver film resulting in local disconnections between the metallic particles. According to some embodiments, implementations at a large (i.e., commercial) scale can adopt significantly faster annealing methods, such as continuous flash exposure, e.g., less than 10 minutes of sintering by combined low-pressure Ar plasma and microwave flash.

The disclosed nanoporous stamps and disclosed printing methods can be utilized in printing conductive networks for transparent electrodes, as used in light-emitting diodes, liquid-crystal displays, touch-screen panels, solar cells, and numerous other devices where cost-effective fabrication of electrodes with high conductivity and transparency is desired. For example, the CNT honeycomb stamp shown in FIG. 3E was used to print the silver honeycomb of FIG. 4D with a transparency of 94% and a sheet resistance of 3.6Ω/□ after thermal annealing. Such conductivity is about twice and ten times greater than that of the silver nanowires and the indium tin oxide (ITO), respectively, at transparency of >90% as shown in FIG. 4e. Additionally, some embodiments of the disclosed methods do not require or eliminate the need for sputtering, UV lithography, and/or wet etching, and the disclosed nanoporous stamps can provide for flexoprinting via a single-step ambient process.

Printing using the disclosed nanoporous stamps can, in some embodiments, overcome limitations of existing printing methods for electronic materials, including direct printing of features with micron-scale lateral dimensions and fine edge roughness, and attainment of highly uniform thickness in the sub-100 nm range, the sub-90 nm range, the sub-80 nm range, the sub-70 nm range, the sub-60 nm range, the sub-50 nm range, the sub-40 nm range, the sub-30 nm range, the sub-25 nm range, the sub-20 nm range, the sub-15 nm range, the sub-10 nm range, and/or the sub-5 nm range. According to some embodiments, functionality of the new stamp results from high porosity, where the stamp pore size (characteristic length of $d_{pore}$) is i larger than the electrically functional nanoparticles to be printed ($d_{particle}$) but smaller than the stamp features ($W_{stamp}$). For some embodiments, to provide for maintaining ink particles well dispersed within the wet stamp, the pores within the stamp are much larger than the particles ($d_{particle} \ll d_{pore}$). To provide for uniform ink transfer relative to the size of the stamp feature (and thus the resulting printed feature), the pores are significantly smaller than the stamp features ($d_{pores} \ll W_{stamp}$), according to some embodiments. Such features enable capillary action to elegantly confine the ink within the stamp structures until printing. While the disclosed experimental data show that nanoporous CNT stamps, having pores of ~100 nm, can uniformly print ink particles of ~10 nm using stamp features as small as 3 µm (i.e., the narrowest spacing within the honeycomb pattern), it is to be understood that nanoporous stamps with significantly reduced feature sizes in view of the above parameters are also within the scope of the disclosure and provide for increased printing resolution. For example, nanoporous stamps comprising single-walled CNT forests having significantly smaller CNT diameter (1-2 nm) and spacing (~10-20 nm) can be prepared and are suitable for printing sub-micrometer features. Typically, the pore size is smaller than the features to be printed, and the smallest resolution can be determined by the pore size. For example, with a stamp having ~100 nm pore size stamp, a >>100 nm feature size can be printed; and for a stamp having an ~10 nm pore size, a >>10 nm feature size can be printed. The pore size is larger than the printing material, and though an ink can be liquid (in some embodiments), the purpose of the printing (i.e., what will remain in the printed surface) is not a liquid or a solvent but the solid particles after the solvent dries out or after the liquid solidifies (e.g., curing polymer mixtures), so that, for example, for a ~100 nm pore size stamp, <<100 nm sized particles or mocules can be printed, and for a ~10 nm pore size stamp, <<10 nm sized materials or molecules can be printed. Thus, for some implementations, there may be no general optimal pore size, and instead, it is a trade-off between minimum resolution and maximum material size that can be printed by the nanoporous stamps.

Figure 6:
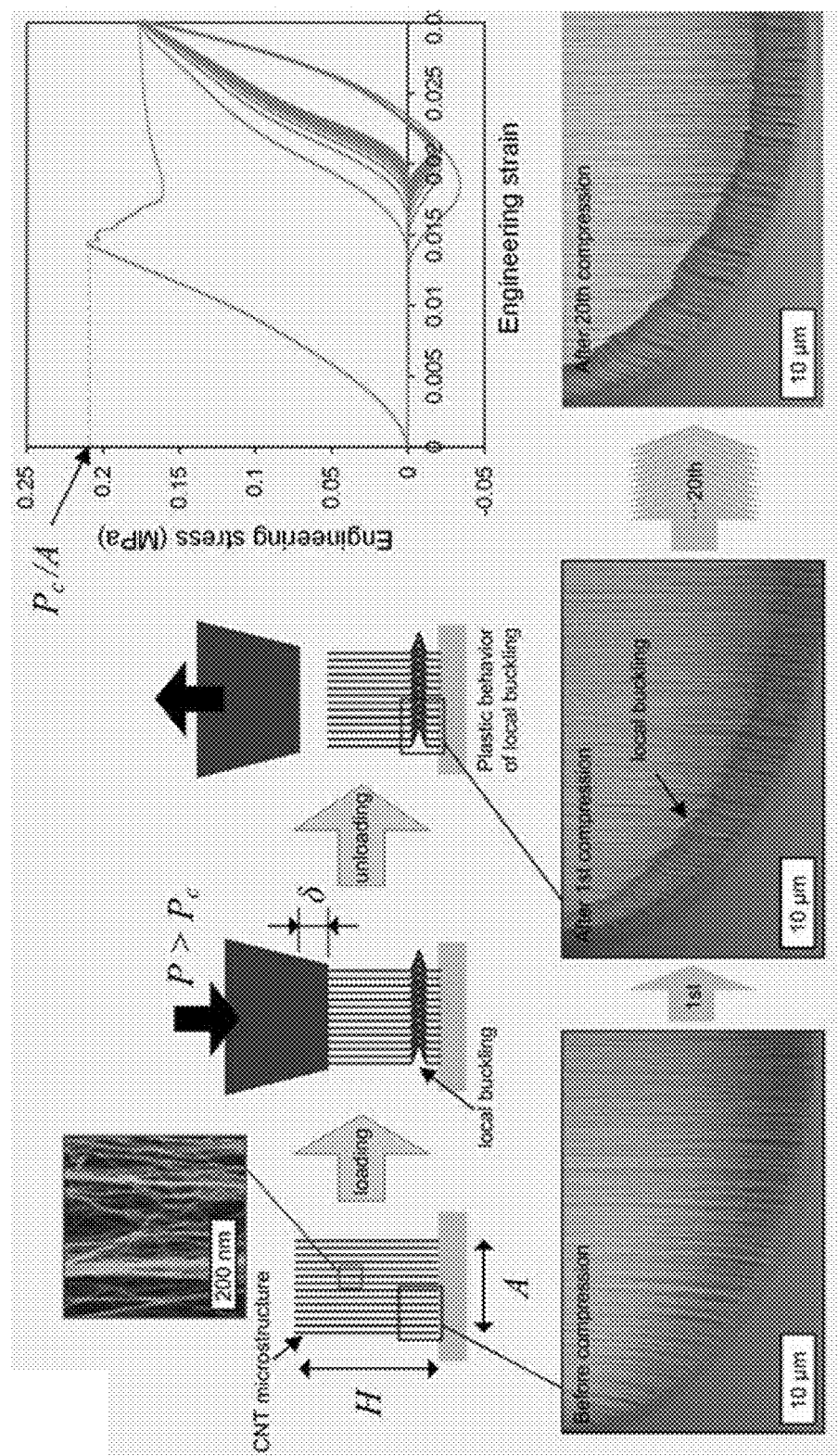
FIGS. 6 and 7 illustrate example uniaxial stress-strain curves and images of the base regions CNT microstructures with and without a conformal coating.
Figure 7:
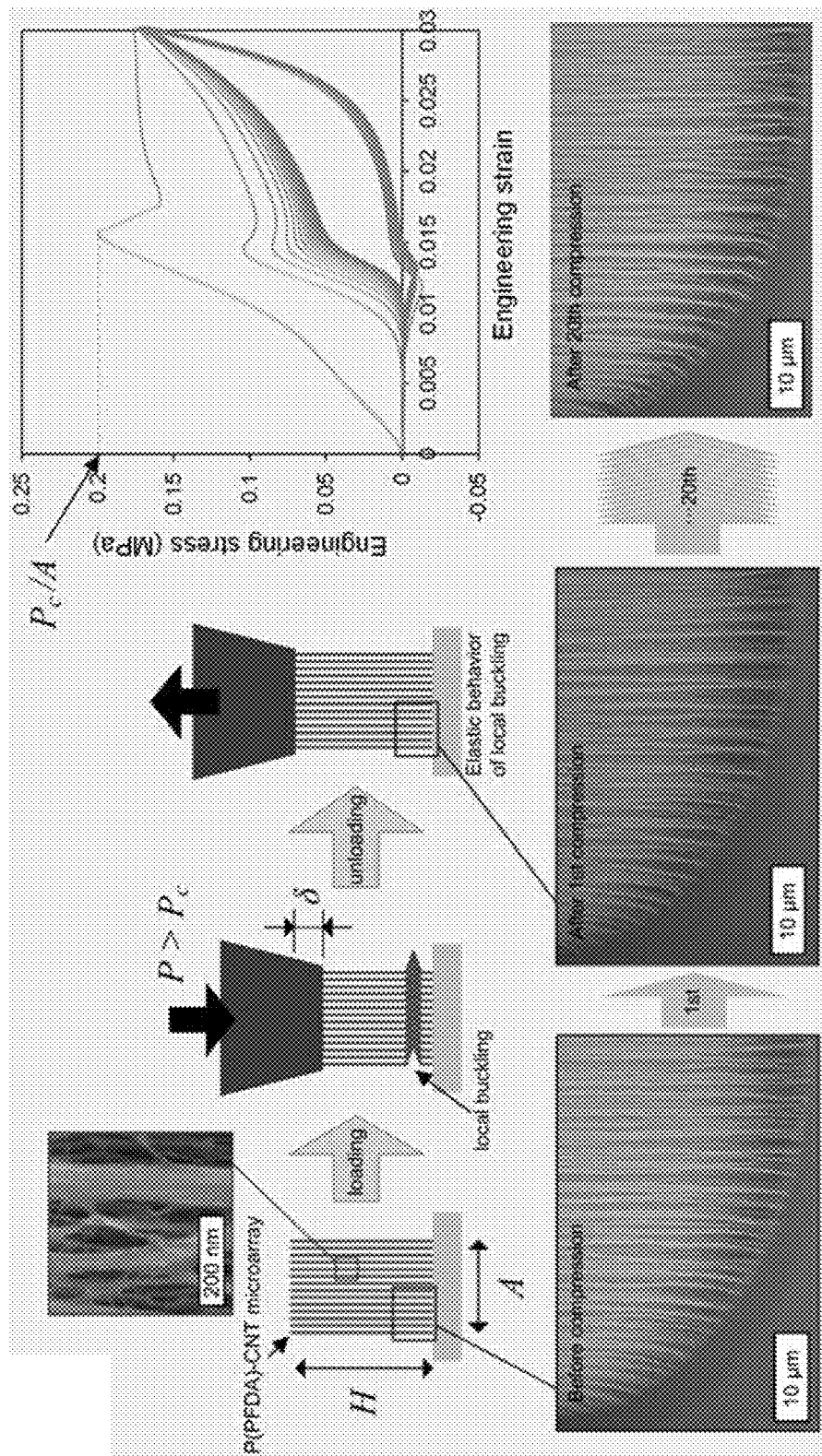

According to some embodiments, the mechanical robustness of the disclosed nanoporous stamps, as exemplified by engineered CNT stamps, provides significant advantages over elastomeric stamps for printing micron-scale features. While studies of roll-to-roll micro-contact printing using elastomeric stamps (e.g., X. Zhou, H. Xu, J. Cheng, N. Zhao and S.-C. Chen, "Flexure-based roll-to-roll platform: a practical solution for realizing large-area microcontact printing," Scientific Reports, vol. 5:10402 (2015), the entirety of which is hereby incorporated by reference), have shown printing of self-assembled monolayers with μm-scale pattern features, these small stamp features are prone to structural failures under deformation, limiting process reliability and the shapes of features that can be printed, as discussed by J. E. Petrzelka and D. E. Hardt, "Static load-displacement behavior of PDMS microfeatures for soft lithography," Journal of Micromechanics and Microengineering, vol. 22, 075015 (2012), the entirety of which is hereby incorporated by reference. Raised polymer stamp features with large spacing or low aspect ratio are prone to roof collapse, and high aspect ratio features are prone to buckling. Because the compliant CNT micro-structures according to some embodiments of the disclosure can be grown on or can be transferred onto rigid substrates, the disclosed nanoporous stamps do not suffer from roof collapse even for patterned features with large spacing or low aspect ratio. Moreover, according to some embodiments, CNT forest microstructures are engineered to recover from large compressive deformations (in some cases 70% or greater), over large numbers of cycles. A conformal polymer coating according to the disclosure further enables the stamp features to withstand extended cyclic loading, as shown in FIG. 5, due to reversible buckling at the base which does not disturb the contact mechanics of the stamp surface. FIG. 6 shows uniaxial stress-strain curves and SEM images of the base regions CNT microstructures with p(PFDA) coating obtained from 20 repeated indentations using a flat punch. FIG. 7 shows uniaxial stress-strain curves and SEM images of the base regions CNT microstructures without p(PFDA) coating obtained from 20 repeated indentations using a flat punch.

The mechanical durability of embodiments of the disclosed nanoporous stamp under varying compressive loads and large numbers of inking/printing cycles increases the utility and practicality of the stamp for a variety of applications, including continuous printing (i.e., roll-to-roll printing) using nanoporous stamps. According to some embodiments, the stamps can be fabricated in cylindrical formats compatible with high-speed printing equipment, such as described in U.S. Pat. Nos. 8,950,324, 8,027,086 and 8,991,314, the entirety of each herein incorporated by reference. For example, in one implementation, the CNT growth catalyst is deposited directly onto a roll prior to CNT growth and the CNTs are grown and processed on the roll. In an alternative implementation, CNTs are grown on flat substrates (e.g., glass plates) and then transferred and affixed to a flexible substrate. Depending on the embodiment, this may be done with an adhesive or without an adhesive (e.g., by applying a high force), as discussed in Daeyoung Kim et al., J. Micromech. Microeng. 24 055018 (2014), the entirety of which is herein expressly incorporated by reference. In addition, in some embodiments, to avoid the use of photolithography for stamp fabrication, CNT forests can be grown from a non-patterned catalyst layer, and then microstructured using subtractive methods, such as laser ablation.

IV. EXPERIMENTAL DATA AND MEASUREMENTS

The below provides specific experimental examples of nanoporous stamp fabrication, inking/printing, and characterization according to an implementation of one embodiment of the disclosure.

Nanoporous Stamp Fabrication

In this embodiment, for the growth of vertically aligned CNTs, an $Al_2O_3$/Fe catalyst layer was first patterned on 4" (100) silicon wafers coated with 300 nm of thermally grown $SiO_2$, by lift-off processing using photolithography followed by ultrasonic agitation in acetone. The catalyst layer, 10 nm of $Al_2O_3$ and 1 nm of Fe, were sequentially deposited by electron beam physical vapor deposition. The wafer with the deposited catalyst was diced into ~2×2 cm pieces and placed in the quartz tube furnace for the CNT growth. The growth recipe started with flowing 100/400 s.c.c.m. of $He/H_2$ while heating the furnace up to 775° C. over 10 min (ramping), and then held at 775° C. for 10 min with the same gas flow rates (annealing). Then the gas flow was changed to 100/400/100 s.c.c.m. of $C_2H_4/He/H_2$ at 775° C. for CNT growth for the selected duration. In this implementation, the typical growth rate was ~100 μm/min. After the growth, the furnace was cooled down to <100° C. at the same gas flow and finally purged with 1,000 s.c.c.m. of He for 5 min. For plasma-etching, the CVD grown CNTs were exposed to an oxygen plasma with 80/20 of $Ar/O_2$ gas flow for 5 min at 50 W and 200 mTorr pressure using a Diener Femto Plasma system.

For conformal polymer coating, iCVD polymerization was carried out in a custom-built cylindrical reactor (diameter 24.6 cm and height 3.8 cm) with an array of 14 parallel chromoalloy filaments (Goodfellow) suspended 2 cm from the stage. The reactor was covered with a quartz top (2.5 cm thick) that allowed real-time thickness monitoring by reflecting a 633 nm He—Ne laser source (JDS Uniphase) off the substrate/polymer and recording the interference signal intensity as a function of time. The reactor was pumped down by a mechanical Fomblin pump (Leybold, Trivac) and the pressure was monitored with a MKS capacitive gauge. The liquid monomer (1H, 1H, 2H, 2H-perfluorodecyl acrylate, PFDA, 97% Aldrich) and the initiator (tert-butyl peroxide, TBPO, 98% Aldrich) were used as received without further purification. TBPO was kept at room temperature (Tf=25° C.) and was delivered into the reactor through a mass flow controller (1479 MFC, MKS Instruments) at a constant flow rate of 1 s.c.c.m. in process A, and 3 s.c.c.m. and 1 s.c.c.m. in DVB and PFDA polymerization during process B, respectively. Initiator radicals (TBO) were created by breaking only the labile peroxide bond of the TBPO at filament temperature of Tf=250° C. during iCVD polymerization. The PFDA monomer was vaporized in glass jars heated to 80° C. and then introduced to the reactor through needle valves at constant flow rates of 0.2 s.c.c.m. The substrate temperature was kept at Ts=30° C. (within ±1° C.) using a recirculating chiller/heater (NESLAB RTE-7). All of the temperatures were measured by K-type thermocouples (Omega Engineering). The working pressure was maintained at 60 mTorr using a throttle valve (MKS Instruments). At the end an ultrathin layer of pPFDA (approximately 30 nm thick) was deposited within a 25 minute deposition time. The thickness of the pPFDA, deposited on to a control silicon substrate during iCVD polymerization, was also measured using ellipsometry. The p(PFDA) coated CNTs were then again exposed to an oxygen plasma for 30 sec at 30 W and 200 mTorr pressure to increase the surface wettability.

Nanoporous Stamp Inking and Printing

In this embodiment, for inking, 100-300 μL of ink was applied on the nanoporous stamp by a pipette, then the stamp was spun at 1,500 rpm for 0.5-5 minutes. A plasma-treated non-patterned CNT forest was brought into contact against the top surface of the stamp by its own weight for 1-5 seconds. For printing, the target substrate contacted the stamp at ~50 kPa of contact pressure for 1-5 seconds. The normal load applied by a dead weight placed above the substrate. Microslide glasses (VWR INTERNATIONAL LLC, surface roughness of ~1-2 nm) and polyethylene terephthalate (PET) film with 0.004" (MCMASTER-CARR, average roughness ~6-10 nm) were used as the target substrates. The PET films were attached to a microslide glass by a double-sided tape when printing. The ink used was composed of silver nanoparticles dispersed in tetradecane (SIGMA-ALDRICH, Product no. 736511). The particle concentration was 50-60 wt. % with particle sizes less than 10 nm. The viscosity of the ink ranged from 8 cP to 14 cP with a surface tension 27-30 dyn/cm.

Characterization

The mechanical properties of stamp microstructures for this embodiment were characterized by a nanoindenter (HYSITRON TI900). To characterize the surface properties, a 10 μm radius tip was indented to maximum depth of 1 μm and the surface modulus was determined via the Oliver-Pharr method from the load-displacement curve. To characterize the bulk properties, a 100 μm flat tip was indented to maximum depth of 4.5 μm and compressive modulus was determined from the unloading curve assuming a uniaxial compression. Micropillars having 100 μm diameter and ~150 μm height were used for all the indentation tests. For wetting/dewetting tests, array of the micropillars were wetted by 10-100 μL water droplet and imaged by a high-speed camera. The optical microscope (ZEISS AXIOCAM) images of printed silver nanoparticle inks were taken right after the printing. The scanning electron microscope (ZEISS MERLIN) and atomic force microscope (VEECO METROLOGY NANOSCOPE IV) images of printed silver nanoparticle inks were taken 3-10 days after printing or after sintering at 200, 300, 400, and 500° C. for 10, 30, 60, 120 minutes on a hot plate. To measure the conductivity of printed silver nanoparticles, 15 line structures having 20 μm width, 200 μm spacing, and 4 mm length were printed on silicon substrates. Electrically conductive silver epoxy (ELECTRON MICROSCOPY SCIENCES) was used to connect each end of the line structures. Then, resistances were measured by a multi-meter (NATIONAL INSTRUMENTS VIRTUAL BENCH) from one end to another, and conductivities were calculated from the average resistance of 15 lines. To measure the transmission and sheet resistance, 1.5×1.5 cm honeycomb pattern arrays were printed on microscope glass slides. Optical transmissivity was measured using a spectrophotometer (CARY UV-visible-NR transmission/reflectance spectrophotometer) and the sheet resistances were measured using a four-point probe (JANDEL RM3-AR).

V. ADDITIONAL EMBODIMENTS AND EXAMPLES

Although discussed above with specific examples, it is to be understood that a variety of other features, attributes and implementations are within the scope of this disclosure. In some embodiments, a nanoporous print stamp may be a direct contact and/or micro-contact nanoporous print stamp. In some implementation, the nanoporous stamp comprises a substrate and a plurality of CNTs. In some embodiments, the plurality of CNTs can include a patterned or non-patterned array of CNTs disposed on the substrate. The array of CNTs can, in some embodiments, be aligned or substantially aligned CNTs disposed on and attached to the substrate. Depending on the implementation, the substrate can comprise, by way of non-limiting example, a metal, a ceramic, and/or a polymer. Embodiments of the nanoporous stamp include a wettable nanoporous structure, and can also include a treated or etched top surface, though in some embodiments, fabrication, such as a CNT growth process, may be controlled such that etching or other treatment is not required to provide the disclosed benefits of the nanoporous stamp. In some embodiments, a coating may be disposed on the stamp material. Depending on the implementation, the coating (e.g., coating for CNTs) may be a polymer, a metal, and/or a ceramic. In some embodiments, the coating adjoins and/or bonds at least a portion of the CNTs. The coating can be a conformal coating. The coating can be configured to reduce capillary-induced deformation the stamp. In one implementation, a polymer coating is in the form of a conformal coating configured to reduce capillary-induced deformation of a patterned array of aligned CNTs. In some implementations, the CNTs include, comprise, consist essentially of, or consist of single wall CNTs, while in other implementations, the CNTs include, comprise, consist essentially of, or consist of multi-wall CNTs. In some embodiments, the surface modulus of the stamp and the compressive modulus of the stamp are the same order of magnitude. In some embodiments, the surface modulus of the stamp is less than twice (2×) the compressive modulus of the stamp. In some implementations, the surface modulus of an array of (aligned) carbon nanotubes of the stamp and the compressive modulus of the array of aligned carbon nanotubes are the same order of magnitude, and in some implementations, the array is patterned. In some implementations, the surface modulus of an array of (aligned) carbon nanotubes of the stamp is less than twice (2×) the compressive modulus of the array of (aligned) carbon nanotubes. In some embodiments, the average pore size of the nanoporous surface of the stamp is 100 nm or less. In some embodiments, the stamp is configured for roll-to-roll printing.

A variety of method may be utilized to make a nanoporous printing stamp. For example, one exemplary method of making a nanoporous printing stamp having a wettable nanoporous surface and structure comprises growing an array of CNTs on a substrate, and depending on the implementation, the array of CNTs can be aligned or substantially aligned. The method can further include treating the upper surface of the array of CNTs to remove a surface cluster layer; applying a conformal polymer coating to the treated upper surface of the array of CNTs, whereby resistance to elastocapillary densification is increased and capillary-induced deformation of the array is reduced; and removing nonconformal portions of the applied coating to provide a wettable nanoporous surface and/or structure. The substrate can include, by way of non-limiting example, gold, silicon, quartz, glass, copper, aluminum, graphite, aluminum oxide, and the like, and/or mixtures thereof. The method may further include transferring the array of aligned carbon nanotubes from the substrate to a flexible substrate, wherein the transferring includes adhering the array of aligned carbon nanotubes to the flexible substrate. In some embodiments, the method includes patterning the array of carbon nanotubes, in some implementations, via laser ablation. In some implementations, treating the surface of the array of carbon nanotubes comprises plasma etching. In some implementations, the surface cluster layer removed has a thickness of approximately 1 μm. In some embodiments, removing nonconformal portions of the applied coating comprises oxygen plasma treatment. For some embodiments, nanoporous can be understood to be based on pore size, where pore size can refer to average void size or diameter, average spacing between any two elements in an array, and/or the like. Depending on the implementation, nanoporous can refer to having an average pore size less than 1 micron, less than 250 nm, less than 200 nm, less than 175 nm, less than 150 nm, less than 140 nm, less than 130 nm, less than 120 nm, less than 110 nm, less than 100 nm, less than 95 nm, less than 90 nm, less than 85 nm, less than 80 nm, less than 75 nm, less than 70 nm, less than 65 nm, less than 60 nm, less than 65 nm, less than 60 nm, less than 55 nm, less than 50 nm, less than 45 nm, less than 40 nm, less than 35 nm, less than 30 nm, less than 25 nm, less than 20 nm, less than 15 nm, or less than 10 nm.

Figure 8:
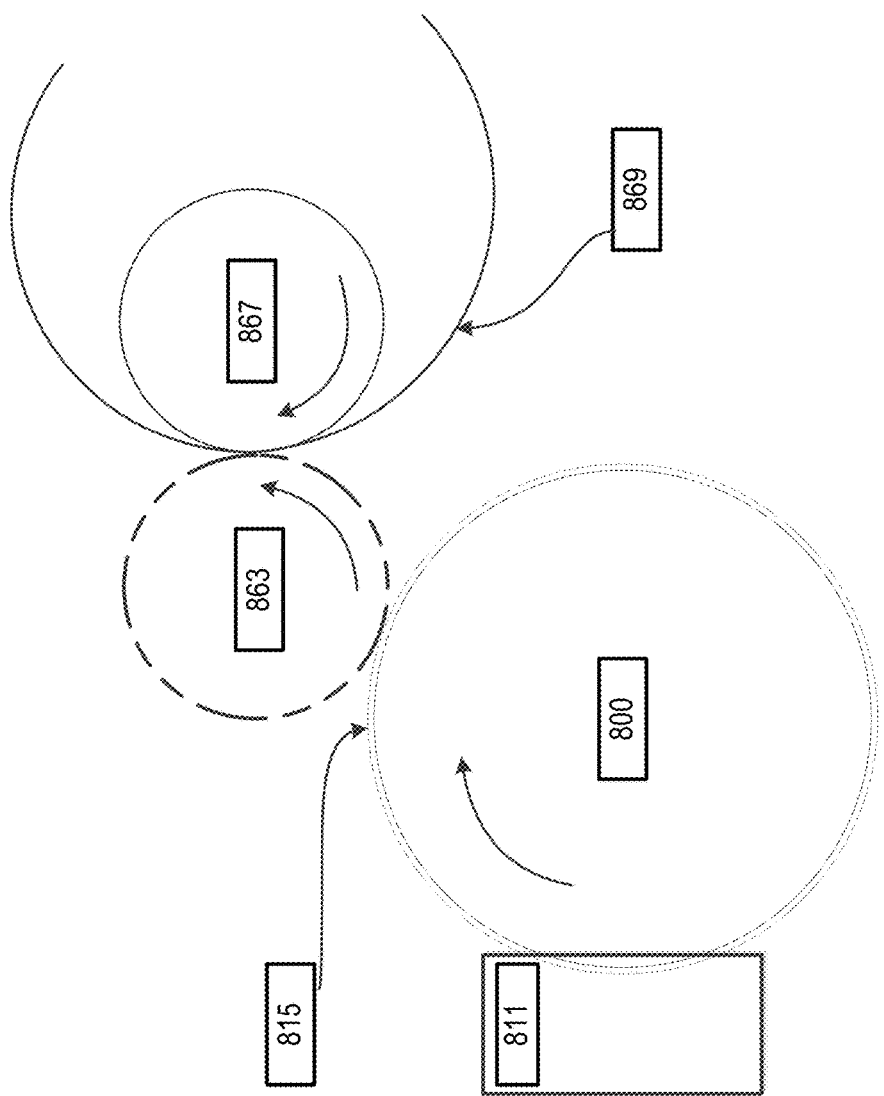
FIG. 8 provides an overview of an example implementation of one embodiment of a nanoporous print stamp.

In some embodiments, a method of printing with a nanoporous stamp is disclosed. Such a method may include loading the surface with ink and contacting a substrate to print the ink on the substrate. In some embodiments, the method comprises loading a patterned nanoporous stamp with ink, where the patterned nanoporous stamp has a plurality of micro-scale features, and during the loading, ink is drawn into microstructures via capillary wicking; contacting the loaded patterned nanoporous stamp with a nanoporous material to remove excess ink from the patterned nanoporous stamp; and printing a pattern on a target substrate with the loaded patterned nanoporous stamp. In some implementations, the printing may be by conformally contacting the patterned nanoporous stamp to the target substrate to form nanoscale contact points between the target substrate and the plurality of micro-scale features of the nanoporous stamp such that ink is drawn out of the microstructures and onto the target substrate. The method can, in some embodiments, include applying pressure during printing such that printed features of the pattern on the target substrate substantially match the plurality of micro-scale features of the patterned nanoporous stamp. Depending on the implementation, the pressure applied can be greater than about 0.5 kPa and less than about 200 kPa and/or greater than 1 kPa and less than 175 kPa. In some implementations, the pressure applied is: less than than 150 kPa, less than 125 kPa, less than 100 kPa, less than 75 kPa, less than 50 kPa, less than 40 kPa, less than 30 kPa, less than 20 kPa, less than 15 kPa, less than 10 kPa, less than 9 kPa, less than 8 kPa, less than 7 kPa, less than 6 kPa, less than 5 kPa, less than 4 kPa, less than 3 kPa, or less than 2 kPa. In some embodiments, the ink comprises a solvent having a surface tension less than 150 mN/m, less than, 125 mN/m, less than 110 mN/m, less than 100 mN/m, less than 90 mN/m, less than 80 mN/m, less than 70 mN/m, less than 60 mN/m, or less than 50 mN/m. In some embodiments, the ink may be a colloidal ink, in some implementations, including functional nanoparticles. In some embodiments, the average pore size of a nanoporous stamp is (a) substantially larger than the average size of the functional nanoparticles of the ink and/or molecules therein. In some embodiments, where the nanoporous stamp includes microscale features, the average pore size of the nanoporous stamp is smaller than the micro-scale features. In some embodiments, printed features of a stamp pattern on a target substrate have an average line edge roughness of less than 2 µm, less than 1 µm, or less than 0.5 µm. In some embodiments, the nanoporous stamp and/or printing method using same is configured such that printed features of a pattern on target substrate have linewidth less than 20 µm, less than 15 µm, less than 10 µm, less than 9 µm, less than 8 µm, less than 7 µm, less than 6 µm, less than 5 µm, less than 4 µm, less than 3 µm, less than 2 µm, or less than 1 µm. In some embodiments, the nanoporous stamp and/or nanoporous stamp printing method is configured such that printed features of a nanoporous stamp printed pattern on target substrate have average thickness less than 150 nm, less than 125 nm, less than 100 nm, less than 75 nm, or less than 50 nm. In some embodiments, printed features of the pattern on target substrate have uniform thickness with tolerance less than 50 nm, less than 40 nm, less than 30 nm, less than 20 nm, less than 15 nm, or less than 10 nm. Depending on the implementation, the pore size can be selected based on the desired thickness of the ink to be printed to provide confinement to the flow of liquid, for example, to provide printing for a transparent conductor of a display on smartphone, where the pattern features may be relatively large, but the thickness applied is sub-micron thickness. In some implementation, the nanoporous surface may apply the ink to a first non-porous surface and then the non-porous surface is contact to the target substrate to apply the pattern. For example, in some embodiments, a nanoporous stamp of the disclosure may be substituted in place of an anilox roller in flexographic printing, such that the nanoporous surface is the ink pad, and then it transfers the ink to a nonporous surface, and then the nonporous surface transfers the ink to a target substrate. FIG. 8 provides an overview of one embodiment where the nanoporous print stamp 800 is configured as a roller or cylinder having a nanoporous surface 815. The nanoporous print stamp receives ink from the ink supply 811 and transfers the ink from the nanoporous surface 815 to a non-porous (or substantially non-porous) roller 863. The ink is then transferred from the non-porous roller 863 to the substrate 869 as the substrate 869 passes between the non-porous roller 863 (e.g., a patterned or unpatterned roller) and the impression roller 867. In some embodiments, the non-porous roller is an elastic printing plate roller. In some embodiments, the non-porous roller is a traditional flexographic non-porous roller. Depending on the implementation, some embodiments can be configured for use with traditional flexographic printing materials and machinery. Such embodiments may provide for printing very thin patterns and/or remove the need for a doctor blade and/or other components or process that may be required with traditional flexographic printing.

Although discussed in terms of CNTs, it is to be understood that other nanoporous materials may be used within the scope of the disclosure provided they provide the desired pore size, printing resolution, and so forth. For example, a nanoporous surface may be made from casting a film of particles, compacting them to create at least a partially fused or sintered assembly that have nanopores defined between them. In some embodiments, the nanoporous stamp and/or nanoporous surface comprises nanowires, such as silicon nanowires formed from chemical etching. A film of CNTs, a cast aerogel, an carbon or other aerogel (e.g., as described in U.S. Pat. No. 9,073,759, the entirety of which is herein incorporated by reference), and/or a nanocarbon foam can also be utilized as the nanoporous stamp. Such embodiments could, for example, be cast on substrate and/or micro-patterned mold. Additionally, a nanoporous surface for a nanoporous stamp may be made from 3d printing via photopolymerization, which can create structured features of nanoscale dimensions. In some embodiments, the void volume of the nanoporous stamp material is greater than 10%, greater than 20%, greater than 30%, greater than 40%, greater than 50%, greater than 60%, greater than 70%, greater than 80%, or greater than 90%. In some embodiments, the void volume of the nanoporous stamp material is less than 99%, less than 98%, less than 97%, less than 96%, less than 95%, less than 94%, less than 93%, less than 92%, less than 91%, or less than 90%.

VI. CONCLUSION

The disclosed nanoporous stamps and associated methods provide for micrometer and sub-micrometer resolution printing, including printing of liquid-phase inks comprising electronic materials. Disclosed methods that include using nanoporous stamp material to induce nanoscale liquid transfer under microscale contact contrast with conventional printing tools and methods that require significant process complexity for scaling down print resolution. Moreover, the tunable mechanical and surface properties of the disclosed nanoporous stamps and CNT composite microstructures are beneficial for material design having extremely high porosity and nanoscale surface compliance while retaining micro-/macro-scale structural robustness. Printing via the disclosed nanoporous stamps and associated methods can provide low-cost manufacturing of printed electronics having high-resolution features, and may enable integration of sensing and computation in large-area and/or unconventional format, such as on windows, contact lenses, and ultrathin membranes, and may further be utilized in connecting devices and/or tracking objects such as medicines, foods, and products during transportation and/or use. As a non-limiting example, the disclosed stamps and methods may be used for printing RFID tags, including roll-to-roll printing of RFID tags on plastic film.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto; inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented in any of numerous ways. For example, some embodiments (e.g., of designing nanoporous stamps, fabricating nanoporous stamps, and/or operating printing processes using nanoporous stamps to produce nanoporous stamp patterns on target substrates) may be implemented using hardware, software, or a combination thereof. When implemented in software, the software code can be executed on any suitable processor or collection of processors, whether provided in a single computer or distributed among multiple computers.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

A flow diagram is used herein. The use of flow diagrams is not meant to be limiting with respect to the order of operations performed. The herein described subject matter sometimes illustrates different components contained within, or connected with, different other components. It is to be understood that such depicted structures or processes are merely exemplary, and that in fact other structures or processes can be implemented which achieve the same functionality.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A method of flexographic nanoporous stamp printing, the method comprising:
   loading a patterned nanoporous stamp with ink, the patterned nanoporous stamp having a plurality of micro-scale features, wherein during the loading, ink is drawn into microstructures via capillary wicking;
   contacting the loaded patterned nanoporous stamp with a nanoporous scour to remove excess ink from the patterned nanoporous stamp; and
   printing a pattern on a target substrate with the loaded patterned nanoporous stamp by conformally contacting the patterned nanoporous stamp to the target substrate to form nanoscale contact points between the target substrate and the plurality of micro-scale features of the nanoporous stamp such that ink is drawn out of the microstructures and onto the target substrate,
   wherein loading the patterned nanoporous stamp with the ink includes loading the ink into each micro-scale feature in the plurality of micro-scale features, each micro-scale feature including a plurality of carbon nanotubes disposed on and attached to a substrate.

2. The method of claim 1, wherein the printing includes applying pressure during printing such that printed features of the pattern on the target substrate substantially match the plurality of micro-scale features of the patterned nanoporous stamp.

3. The method of claim 1, wherein the pressure applied is greater than about 0.5 kPa and less than about 200 kPa.

4. The method of claim 1, wherein the ink comprises a solvent having a surface tension less than 100 mN/m.

5. The method of claim 1, wherein the ink is a colloidal ink comprising functional nanoparticles.

6. The method of claim 5, wherein average pore size of the patterned nanoporous stamp is (a) substantially larger than the average size of the functional nanoparticles of the ink, and (b) smaller than the micro-scale features.

7. The method of claim 1, wherein at least a portion of printed features of the pattern on the target substrate have an average line edge roughness of less than 2 μm.

8. The method of claim 1, wherein at least a portion of the printed features of the pattern on the target substrate have a linewidth less than 10 μm.

9. The method of claim 1, wherein at least a portion of the printed features of the pattern on the target substrate have an average thickness of less than 100 nm.

10. The method of claim 1, wherein the printed features of the pattern on the target substrate have a substantially uniform thickness with a tolerance less than 20 nm.

11. The method of claim 1, wherein the nanoporous scour is an unpatterned nanoporous stamp.

12. The method of claim 1, wherein the average porosity of the nanoporous stamp is substantially the same as the average porosity of the nanoporous scour.

13. A method, comprising: printing using a nanoporous print stamp, wherein the nanoporous print stamp is configured for flexographic printing and comprises:
   a substrate;
   a patterned arrangement of carbon nanotubes disposed on and attached to the substrate, the arrangement of carbon nanotubes having a top surface having an average pore size of 100 nm or less, and a wettable, nanoporous structure; and
   a secondary material disposed on the carbon nanotubes whereby the secondary material adjoins at least portions of the carbon nanotubes and is configured to reduced capillary-induced deformation of the arrangement of carbon nanotubes when in use,
   the printing including:
   loading the nanoporous print stamp with ink such that ink is drawn into microstructures of the patterned arrangement of carbon nanotubes via capillary wicking;
   contacting the nanoporous print stamp to a non-porous roller such that ink from the nanoporous print stamp drawn out of microstructures of the patterned arrangement of carbon nanotubes and transferred to the non-porous roller; and
   contacting the non-porous roller to a target substrate such that the ink is printed on the target substrate by the non-porous roller.

14. The method of claim 1, wherein the plurality of carbon nanotubes defines an average pore size of about 100 nm or less.

15. The method of claim 1, further comprising: reducing capillary-induced deformation of the plurality of carbon nanotubes during loading the ink using a second material disposed on the plurality of carbon nanotubes, the secondary material adjoining at least portions of the carbon nanotubes.

16. The method of claim 1, wherein loading the patterned nanoporous stamp with the ink includes: contacting a top surface of the plurality of carbon nanotubes with the ink so as to draw the ink into each micro-scale feature via capillary wicking.

17. The method of claim 1, wherein the plurality of carbon nanotubes is at least partially oriented substantially perpendicular to the substrate surface.

* * * * *